United States Patent
Ma et al.

(10) Patent No.: US 11,245,008 B2
(45) Date of Patent: Feb. 8, 2022

(54) THIN FILM TRANSISTOR, MANUFACTURING METHOD THEREOF, SENSOR

(71) Applicant: BOE TECHNOLOGY GROUP CO., LTD., Beijing (CN)

(72) Inventors: Xiaochen Ma, Beijing (CN); Guangcai Yuan, Beijing (CN); Ce Ning, Beijing (CN); Hehe Hu, Beijing (CN); Xin Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/642,522

(22) PCT Filed: Jul. 24, 2019

(86) PCT No.: PCT/CN2019/097455
§ 371 (c)(1),
(2) Date: Feb. 27, 2020

(87) PCT Pub. No.: WO2020/024856
PCT Pub. Date: Feb. 6, 2020

(65) Prior Publication Data
US 2020/0194553 A1 Jun. 18, 2020

(30) Foreign Application Priority Data
Aug. 3, 2018 (CN) .......................... 201810878941.3

(51) Int. Cl.
*H01L 29/10* (2006.01)
*H01L 29/417* (2006.01)
(Continued)

(52) U.S. Cl.
CPC ....... *H01L 29/1033* (2013.01); *G01N 27/414* (2013.01); *G01N 27/4141* (2013.01);
(Continued)

(58) Field of Classification Search
CPC .. G01N 27/4141; G01N 27/414; G01N 27/00; G01N 27/60; G01N 27/4146;
(Continued)

(56) References Cited

U.S. PATENT DOCUMENTS 8,222,096 B2 * 7/2012 Nomoto .............. H01L 51/0004
438/158
9,373,649 B2 * 6/2016 Ning ................... H01L 27/1225
(Continued)

FOREIGN PATENT DOCUMENTS

| CN | 101051037 A | 10/2007 |
|---|---|---|
| CN | 101592626 A | 12/2009 |

(Continued)

OTHER PUBLICATIONS

First Office Action and English language translation, CN Application No. 201810878941.3, dated Aug. 15, 2019, 16 pp.
(Continued)

*Primary Examiner* — Nikolay K Yushin
(74) *Attorney, Agent, or Firm* — Myers Bigel, P.A.

(57) ABSTRACT

The present application provides a TFT, a manufacturing method thereof, and a sensor. The TFT includes a substrate, and a source, a drain and an active layer on the substrate. The active layer includes a microchannel, and the thin film transistor is configured to detect a sample in the microchannel. When a sample to be detected enters the microchannel, the electron distribution in the active layer would be affected, which causes fluctuations in the TFT characteristics. By detecting such fluctuations, detecting the composition and property of the liquid to be detected may be achieved. Moreover, by virtue of the microchannel, the sample may be precisely controlled. The impact of the external environment may be reduced and the detection accuracy can be enhanced. Continuous monitoring instead
(Continued)

of one-time detection of the sample may be achieved and the sample detection efficiency may be improved.

14 Claims, 18 Drawing Sheets

(51) Int. Cl.
  *H01L 29/423* (2006.01)
  *H01L 29/66* (2006.01)
  *G01N 27/414* (2006.01)
  *H01L 29/786* (2006.01)

(52) U.S. Cl.
  CPC .. *H01L 29/41733* (2013.01); *H01L 29/42384* (2013.01); *H01L 29/66742* (2013.01); *H01L 29/786* (2013.01)

(58) Field of Classification Search
  CPC ........... G01N 27/44791; G01N 27/127; G06N 3/063; G06N 3/0481; G06N 3/0454; G06N 3/08; G06N 3/0635; G06N 3/0445; G06N 3/0472; H01L 29/42384; H01L 29/66742; H01L 29/1033; H01L 29/786; H01L 29/41733
  See application file for complete search history.

(56) References Cited

U.S. PATENT DOCUMENTS

| | | | |
|---|---|---|---|
| 2009/0322354 A1 | 12/2009 | Yoo et al. | |
| 2010/0029040 A1* | 2/2010 | Nomoto | H01L 51/0004 438/99 |
| 2013/0200438 A1 | 8/2013 | Liu et al. | |
| 2014/0264468 A1 | 9/2014 | Cheng et al. | |
| 2015/0329904 A1 | 11/2015 | Rothberg et al. | |
| 2016/0035760 A1* | 2/2016 | Ning | H01L 27/1248 257/43 |
| 2016/0320337 A1 | 11/2016 | Cheng et al. | |
| 2016/0351840 A1 | 12/2016 | Annunziata et al. | |
| 2018/0106756 A1 | 4/2018 | Li et al. | |
| 2020/0194553 A1 | 6/2020 | Ma et al. | |

FOREIGN PATENT DOCUMENTS

| | | | | |
|---|---|---|---|---|
| CN | 101592627 A | | 12/2009 | |
| CN | 102242062 A | | 11/2011 | |
| CN | 203445122 | * | 2/2014 | ............. H01L 27/12 |
| CN | 104049021 A | | 9/2014 | |
| CN | 104807869 A | | 7/2015 | |
| CN | 105021683 A | | 11/2015 | |
| CN | 106098941 A | | 11/2016 | |
| CN | 109060922 A | | 12/2018 | |
| KR | 10-1638501 B1 | | 7/2016 | |

OTHER PUBLICATIONS

Second Office Action and English language translation, CN Application No. 201810878941.3, dated Feb. 3, 2020, 10 pp.

* cited by examiner

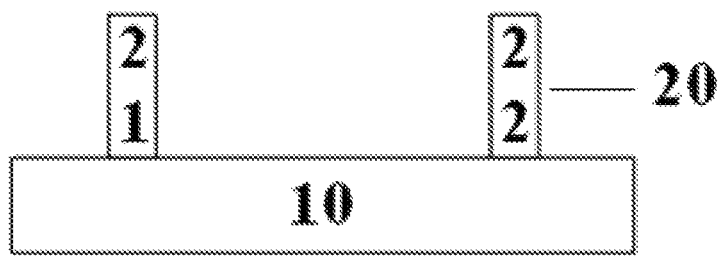
Fig. 11A
Fig. 11B
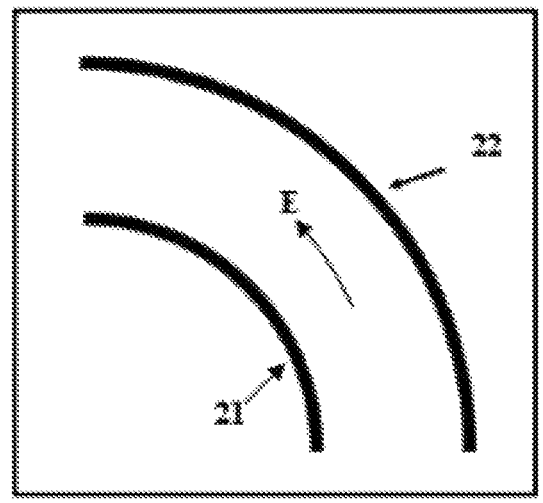
Fig. 11C
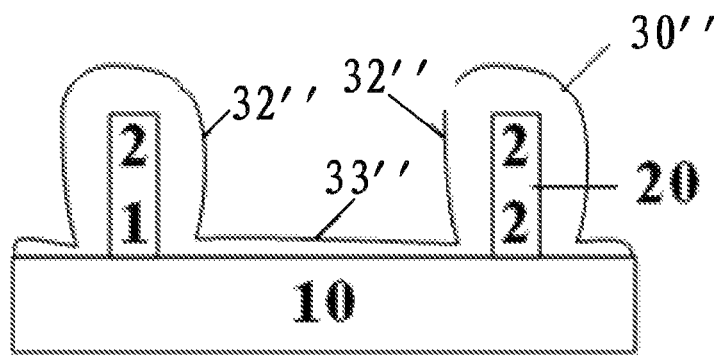
Fig. 11D

US 11,245,008 B2

THIN FILM TRANSISTOR, MANUFACTURING METHOD THEREOF, SENSOR

RELATED APPLICATION

The present application is a 35 U.S.C. 371 national stage application of a PCT International Application No. PCT/CN2019/097455, filed on Jul. 24, 2019, which claims the benefit of Chinese Patent Application No. 201810878941.3, filed on Aug. 3, 2018, the contents of which are incorporated herein by reference in their entireties.

TECHNICAL FIELD

The present disclosure relates to the field of detection technologies, and particularly to a thin film transistor, a manufacturing method thereof, and a sensor.

BACKGROUND

In recent years, sensors based on thin film transistor (TFT) devices have gradually been developed. After a sample to be detected, such as a biological sample, a chemical sample, a medical sample, etc. comes into contact with a TFT, it will cause fluctuations in TFT characteristics. By detecting and analyzing the fluctuations in TFT characteristics, detection of biological, chemical, medical and other sample reagents can be achieved, such as protein detection, DNA detection, and so on.

However, in the related art, a sample to be detected is usually dropped onto a sensing region on the surface of a TFT. Due to the influence of the external environment such as air and humidity during the detection process, the detection result is not accurate enough, and such a detection method can only achieve instantaneous detection instead of continuous monitoring, resulting in low sample detection efficiency.

SUMMARY

An embodiment of the present disclosure provides a thin film transistor, comprising: a substrate, and a source, a drain and an active layer on the substrate. The active layer comprises a first portion and a second portion arranged on the source and the drain respectively, the first portion and the second portion are at least partially spaced apart to form a microchannel between the first portion and the second portion.

In some embodiments, the thin film transistor further comprises a gate and a gate insulating layer, the gate, the gate insulating layer, the source, the drain and the active layer are stacked on the substrate successively, at least a portion of the gate insulating layer serves as a bottom of the microchannel.

In some embodiments, the first portion and the second portion of the active layer extend in a vertical direction facing away a main surface of the substrate, respectively, and an area of a cross section of each of the first portion and the second portion parallel to the main surface of the substrate gradually increases in the vertical direction so that a top of the first portion and a top of the second portion are connected to each other, enabling the microchannel to be a top-closed channel structure.

In some embodiments, an orthographic projection of the first portion on the substrate covers an orthographic projection of the source on the substrate, and an orthographic projection of the second portion on the substrate covers an orthographic projection of the drain on the substrate.

In some embodiments, the active layer further comprises a third portion between the source and the drain, the third portion is in direct contact with the gate insulating layer and serves as the bottom of the microchannel.

In some embodiments, a spacing between the source and the drain is greater than or equal to 5 nanometers and less than or equal to 50 micrometers, the source and the drain both have a height of being greater than or equal to 5 nanometers and less than or equal to 50 micrometers.

Another embodiment of the disclosure provides a sensor comprising the thin film transistor according to any one of the foregoing embodiments.

Yet another embodiment of the disclosure provides a method for manufacturing a thin film transistor, comprising: providing a substrate; forming a source and a drain on the substrate; forming an active layer on the substrate on which the source and the drain are formed, the active layer comprising a first portion and a second portion arranged on the source and the drain respectively, the first portion and the second portion are at least partially spaced apart to form a microchannel between the first portion and the second portion.

In some embodiments, the forming the active layer comprises: by taking the source and the drain as growing points, forming the first portion and the second portion of the active layer on the substrate respectively by a sputtering process.

In some embodiments, the first portion and the second portion of the active layer extend in a vertical direction facing away a main surface of the substrate, and an area of a cross section of each of the first portion and the second portion parallel to the main surface of the substrate gradually increases in the vertical direction so that a top of the first portion and a top of the second portion are connected to each other, enabling the microchannel to be a top-closed channel structure.

In some embodiments, the method further comprises forming a gate and a gate insulating layer on the substrate prior to forming the source and the drain, the forming the active layer further comprises: forming a third portion of the active layer on the gate insulating layer with a material of the active layer, the third portion serving as a bottom of the microchannel.

BRIEF DESCRIPTION OF THE DRAWINGS

In order to explain the technical solutions of embodiments of the present disclosure more clearly, the drawings mentioned in the description of the embodiments of the present disclosure will be briefly introduced below. The drawings described below are just some embodiments of the present disclosure. A person having an ordinary skill in the art can also obtain other drawings based on these drawings without inventive efforts.

FIGS. 11A to 11F illustrate a process of manufacturing a microchannel structure according to some embodiments of the present disclosure.

DETAILED DESCRIPTION OF EMBODIMENTS

Figure 1:
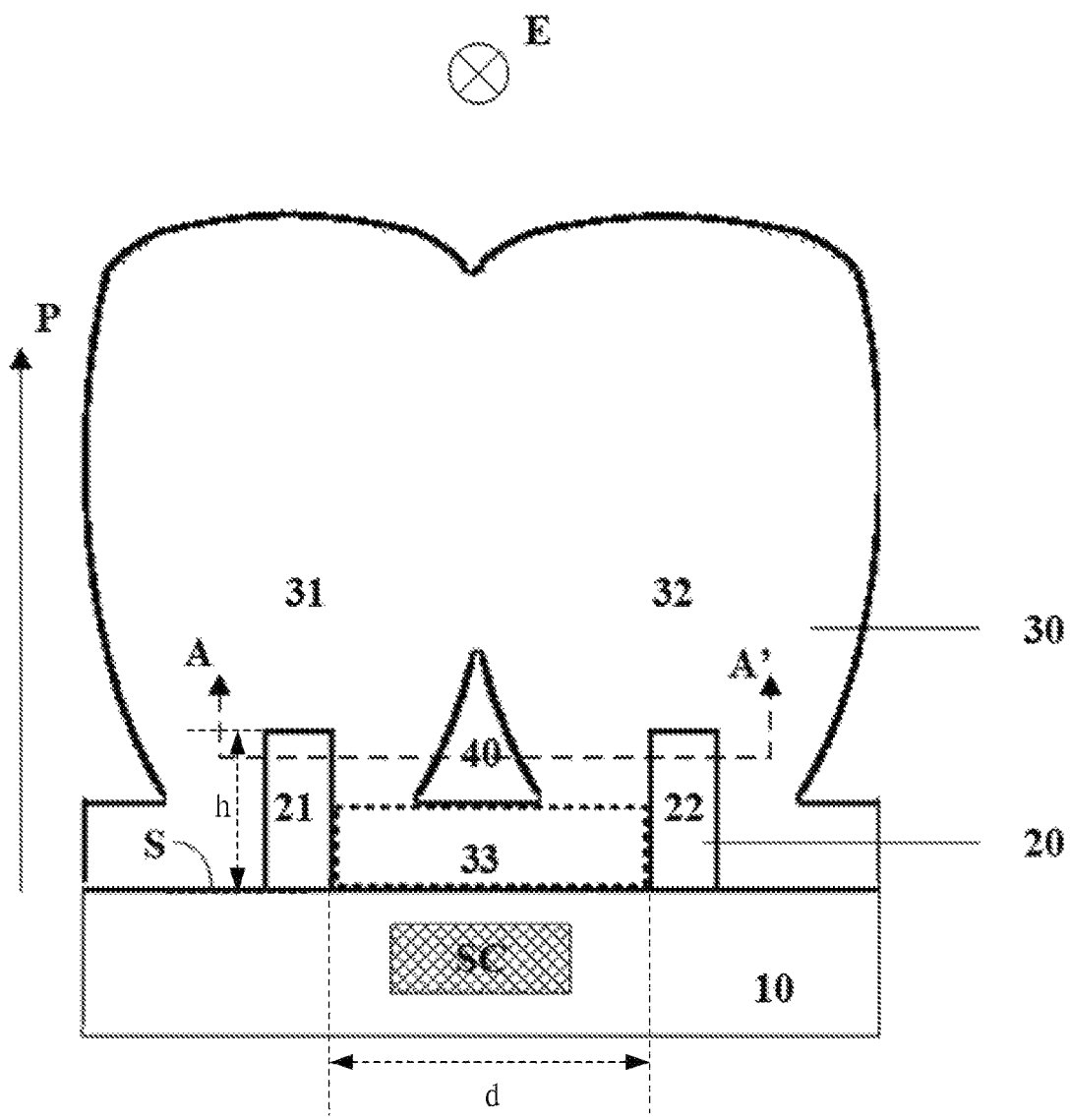
FIG. 1 is a sectional view of a microchannel structure according to some embodiments of the present disclosure.

In order to make the above objectives, features and advantages of the present disclosure more comprehensible, the present disclosure will be further described in detail below with reference to the accompanying drawings and specific embodiments.

Conventional methods for manufacturing a microchannel structure involve complicated and expensive processes such as electron beam lithography and laser interference etching, as well as various subsequent etching, stripping, and assembling processes. Conventional methods are associated with high manufacturing cost, low efficiency, and low scalability. In addition, there are still difficulties in manufacturing a high-resolution or ultra-high-resolution microchannel with the conventional methods.

Therefore, the present disclosure particularly provides a microchannel structure, a sensor, a microfluidic device, a lab-on-chip device, a thin film transistor, and methods for manufacturing a microchannel structure and a thin film transistor, to mitigate or alleviate one or more of the above problems. In an aspect, an embodiment of the present disclosure provides a microchannel structure. In some embodiments, the microchannel structure comprises: a base substrate; a track layer, which is located on the base substrate and comprises a first track and a second track spaced apart from each other; and a wall layer, which is located on a side of the track layer facing away the base substrate and comprises a first wall and a second wall spaced apart from each other, thereby forming a microchannel between the first wall and the second wall. In some embodiments, the microchannel extends in an extension direction along a plane substantially parallel to a main surface of the base substrate, and the extension direction is substantially parallel to an extension direction of the first track and the second track along a plane parallel to the main surface of the base substrate.

The microchannels mentioned in the disclosure are essentially micro-nano channels, which may include microchannels on the order of micrometers and may also include microchannels on the order of nanometers.

As used herein, the term "microchannel" refers to a channel having a sectional size in a range of about 1 nm to about 1000 μm, for example, in a range of about 1 nm to about 50 nm, in a range of about 50 nm to about 100 nm, in a range of about 100 nm to about 1 μm, in a range of about 1 μm to about 10 μm, in a range of about 10 μm to about 100 μm, in a range of about 100 μm to about 200 μm, in a range of about 200 μm to about 400 μm, in a range of about 400 μm to about 600 μm, in a range of about 600 μm to about 800 μm, and in a range of about 800 μm to about 1000 μm. The term "sectional size" may involve height, width and theoretically also diameter. When walls of a channel (including the bottom or top of the channel) are irregular or curved, the terms "height" and "width" may also refer to an average height and an average width, respectively. The microchannel can have any suitable sectional shape, for example, U-shaped, D-shaped, rectangular, triangular, oval, oval-like, circular, semi-circular, square, trapezoidal, pentagonal, hexagonal, and other sectional geometric structures. In some embodiments, the microchannel has an irregular sectional shape. The geometric structure may be constant or may vary along the length of the microchannel. In addition, the microchannel may comprise any type of arrangement or configuration, including linear, non-linear, fused, branched, looped, twisted, stepped and other configurations. In some embodiments, the microchannel may have one or more open ends. In some embodiments, the microchannel may have one or more closed ends. In some embodiments, the microchannel comprises a closed wall structure. In some embodiments, the microchannel has a partially open wall structure. In some embodiments, the microchannel has a fully open wall structure, for example, the microchannel comprises a microgroove.

The sectional size and shape of the microchannel structure provided by the disclosure may be regulated by the spacing between the first track and the second track and the sectional shape of the channel between the first track and the second track. As a result, this can break through the limitation of manufacturing equipment precision, so that a high-precision microchannel structure can be fabricated using a low-precision production equipment, which is suitable for mass production of microchannel structures at high efficiency, large-area, large-scale and low-cost. In addition, by means of the first track and the second track, a closed microchannel structure may be formed using a sputtering technology, and an additional step of forming a microchannel by glass bonding can be avoided, that is, a bonding process can be omitted, which can further simplify the process, and reduce the difficulty in and the cost of manufacturing a microchannel.

Figure 2A:
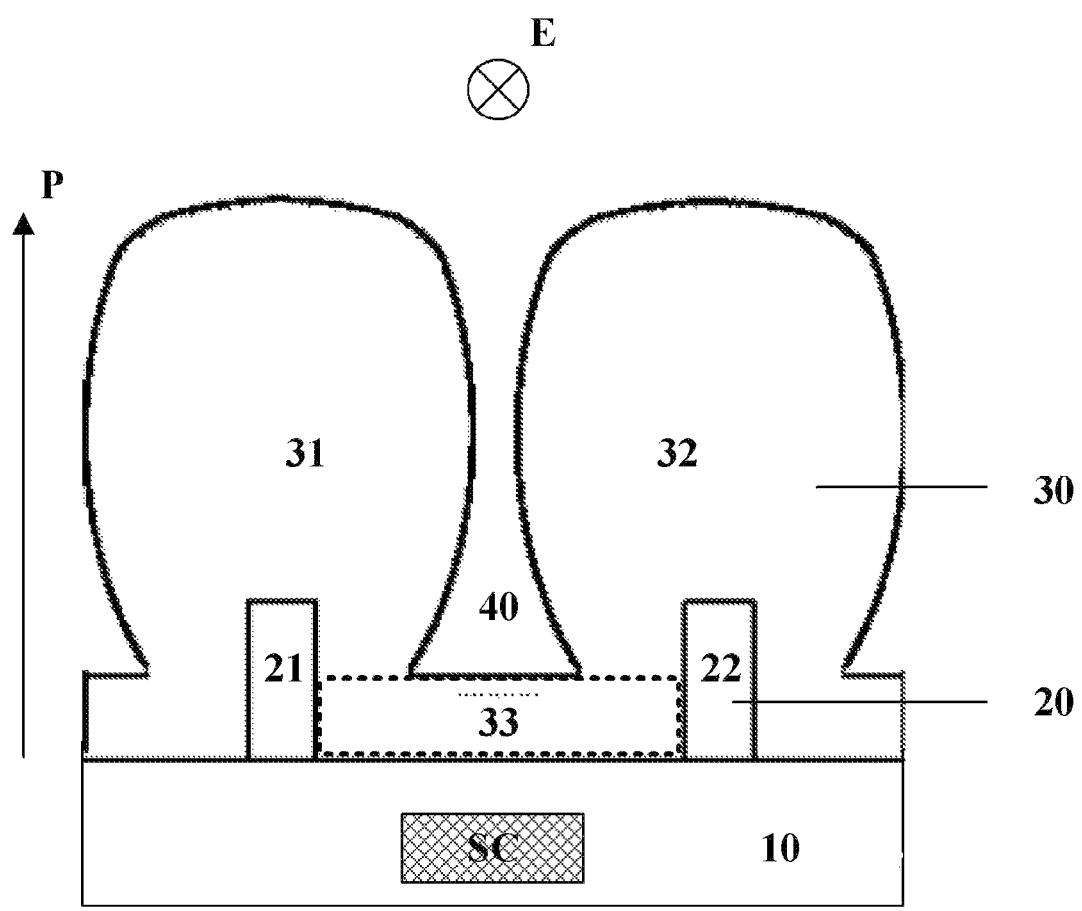
FIG. 2A is a sectional view of a microchannel structure according to some embodiments of the present disclosure.
Figure 2B:
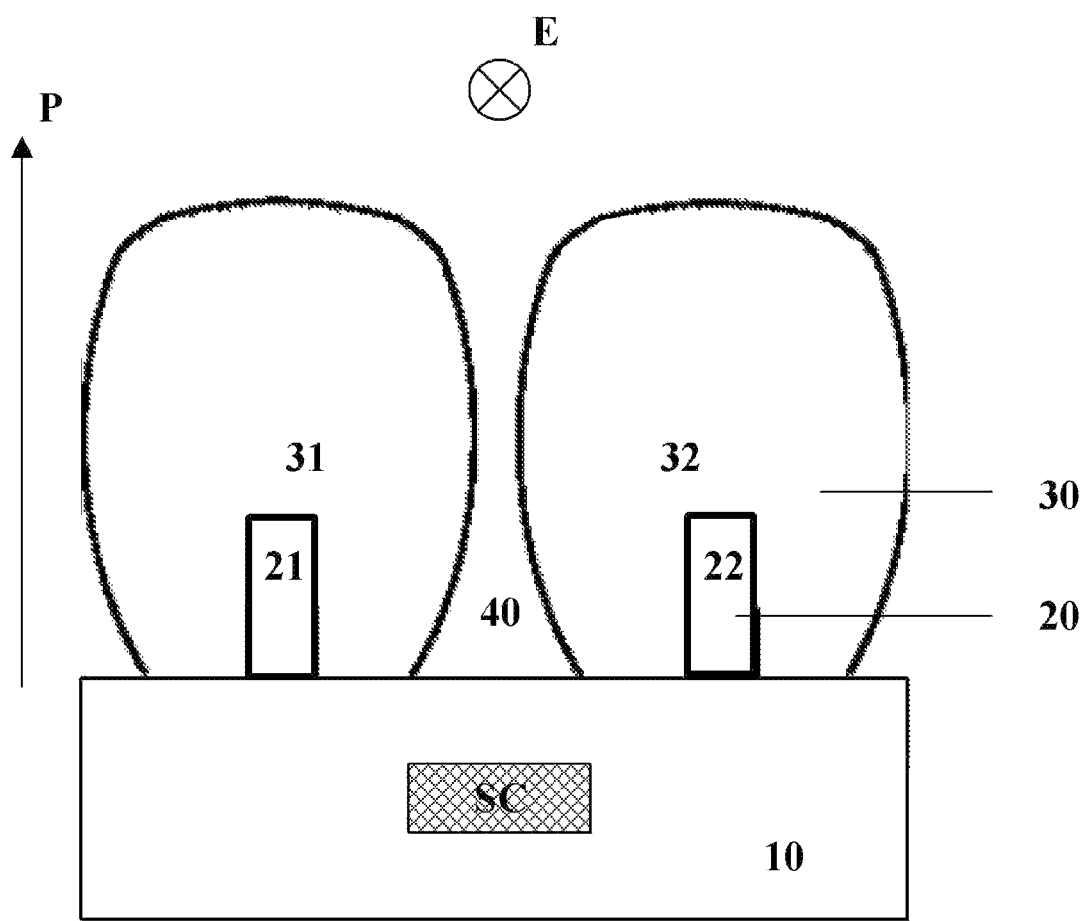
FIG. 2B is a sectional view of a microchannel structure according to some embodiments of the present disclosure.

FIG. 1 is a sectional view of a microchannel structure according to some embodiments of the present disclosure. FIG. 2A is a sectional view of a microchannel structure according to other embodiments of the present disclosure. FIG. 3 is a sectional view taken along the line A-A' in FIG. 1. Referring to FIGS. 1 to 3, the microchannel structure in some embodiments comprises: a base substrate 10; a track layer 20 on the base substrate 10; and a wall layer 30 on a side of the track layer 20 facing away the base substrate 10. The track layer 20 comprises a first track 21 and a second track 22 spaced apart from each other. The wall layer 30 comprises a first wall 31 and a second wall 32 that are at least partially spaced apart from each other, thereby forming a microchannel 40 between the first wall 31 and the second wall 32. As shown in FIG. 3, the microchannel 40 extends in an extension direction E along a plane substantially parallel to a main surface S of the base substrate 10, and the extension direction E is substantially parallel to an extension direction of the first track 21 and the second track 22 along a plane substantially parallel to the main surface S of the base substrate 10.

In some embodiments, an orthographic projection of the first wall 31 on the base substrate 10 substantially covers an orthographic projection of the first track 21 on the base substrate 10. In some embodiments, an orthographic projection of the second wall 32 on the base substrate 10 substantially covers an orthographic projection of the second track 22 on the base substrate 10. In some embodiments, the extension direction E for the microchannel 40 along a plane substantially parallel to the main surface S of the base substrate 10 is substantially parallel to an extension direction of the first wall 31 and the second wall 32 along a plane substantially parallel to the main surface S of the base substrate 10.

Referring to FIG. 2A, in some embodiments, the first wall 31 and the second wall 32 are at least partially separated from each other on a side of the microchannel 40 opposite to the base substrate 10. For example, the microchannel 40 is at least partially open on its side opposite to the base substrate 10. In some embodiments, the first wall 31 and the second wall 32 are separated from each other on the side of the microchannel 40 opposite to the base substrate 10 over the entire length of the microchannel 40 in the extension direction E along a plane substantially parallel to the main surface S of the base substrate 10. For example, the microchannel 40 is a microgroove. In some embodiments, the first wall 31 and the second wall 32 are separated from each other on the side of the microchannel 40 opposite to the base substrate 10 over one or more first portions of the length of the microchannel 40 in the extension direction E along a plane substantially parallel to the main surface S of the base substrate 10, and the first wall 31 and the second wall 32 are connected to each other on the side of the microchannel 40 opposite to the base substrate 10 over one or more second portions of the length of the microchannel 40 in the extension direction E along a plane substantially parallel to the main surface S of the base substrate 10. That is, in this case, a part of the microchannel is a closed channel structure, and the other part of the channel is a groove structure with an upper opening.

Referring to FIG. 2A, in some embodiments, the first wall 31 extends away the first track 21 on the base substrate 10 along a protruding direction P, and the second wall 32 extends away the second track 22 on the base substrate 10 along the protruding direction P. The first wall 31 and the second wall 32 are completely spaced apart from each other over at least a portion of the wall layer 30 along the protruding direction P, thereby forming a microchannel 40 that is at least partially open.

Referring to FIG. 1, in some embodiments, the first wall 31 and the second wall 32 are connected to each other on the side of the microchannel 40 opposite to the base substrate 10. In some embodiments, the microchannel 40 is a closed channel, for example, the microchannel 40 is a microcapillary. In some embodiments, the first wall 31 and the second wall 32 are connected to each other on the side of the microchannel 40 opposite to the base substrate 10 over the entire length of the microchannel 40 in the extension direction E along a plane substantially parallel to the main surface S of the base substrate 10. In some embodiments, the first wall 31 and the second wall 32 are connected to each other on the side of the microchannel 40 opposite to the base substrate 10 over one or more first portions of the length of the microchannel 40 in the extension direction E along a plane substantially parallel to the main surface S of the base substrate 10, and the first wall 31 and the second wall 32 are separated from each other on the side of the microchannel 40 opposite to the base substrate 10 over one or more second portions of the length of the microchannel 40 in the extension direction E along the plane substantially parallel to the main surface S of the base substrate 10.

Figure 4:
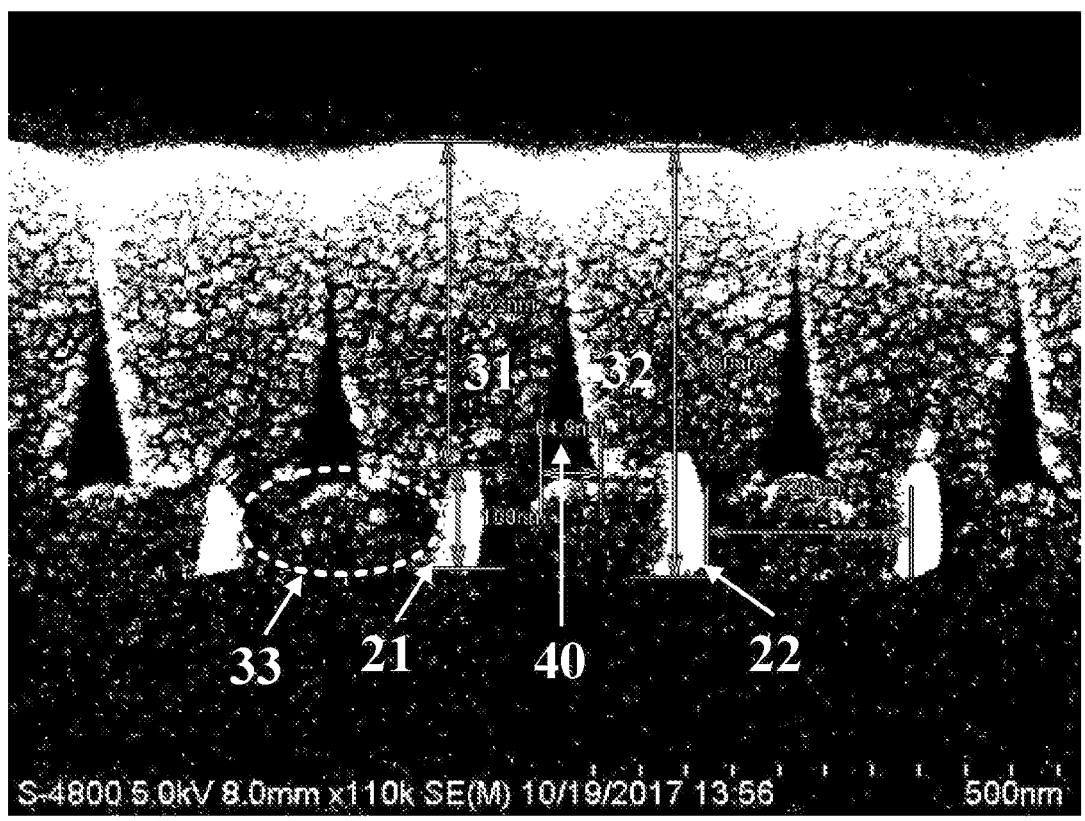
FIG. 4 is a scanning electron microscope image of a section of a microchannel structure according to some embodiments of the present disclosure.
Figure 5:
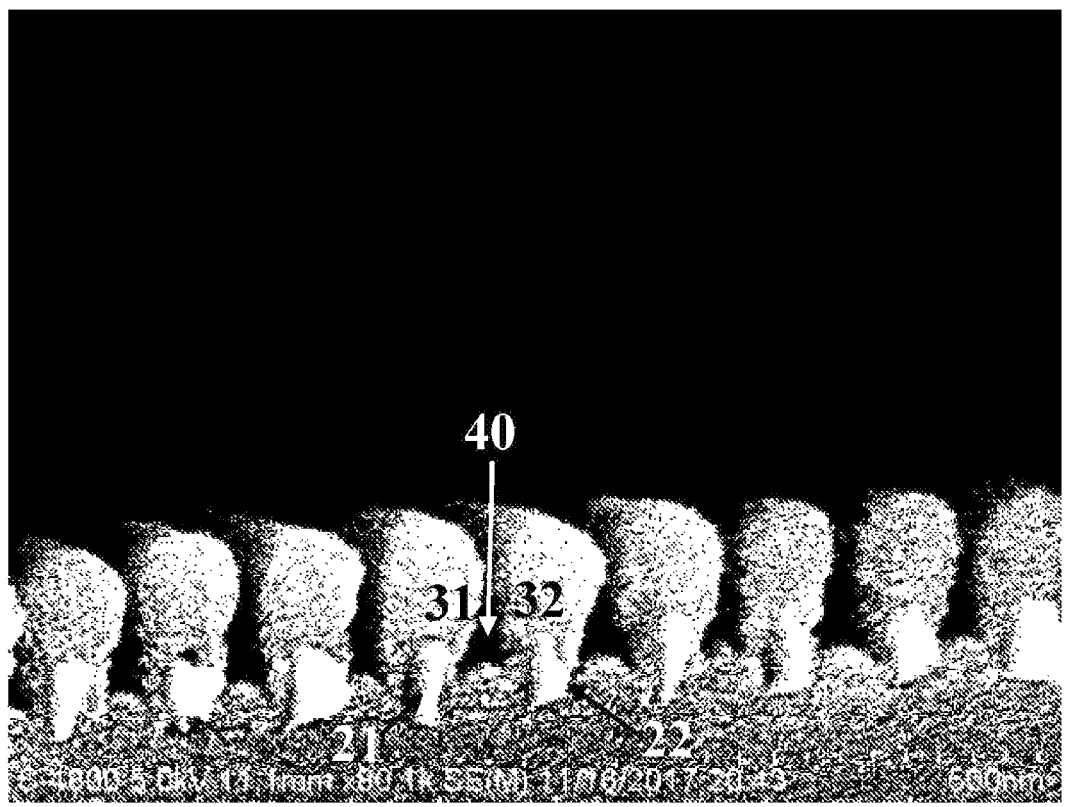
FIG. 5 is a scanning electron microscope image of a section of a microchannel structure according to some embodiments of the present disclosure.

FIG. 4 is a scanning electron microscope image of a section of a microchannel structure according to some embodiments of the present disclosure. FIG. 5 is a scanning electron microscope image of a section of a microchannel structure according to some embodiments of the present disclosure. The microchannel structure in FIG. 4 corresponds to the microchannel structure in FIG. 1, where the microchannel 40 is substantially closed on a side opposite to the base substrate, for example, the microchannel structure forms a microcapillary. The microchannel structure in FIG. 5 corresponds to the microchannel structure in FIG. 2A, where the microchannel 40 is at least partially open on the side opposite to the base substrate, for example, the microchannel comprises a microgroove. In some embodiments, the size of the microchannel 40 is less than 100 nm, for example, the size is between 40 nm and 80 nm. The microchannel may have any appropriate shape. In some embodiments, the microchannel structure has a plurality of turns separated by a plurality of walls. Each of the plurality of walls is shared by two adjacent turns.

Referring to FIGS. 1 and 2A, in some embodiments, the wall layer 30 further comprises a third wall 33 that connects the first track 21 and the second track 22. In some embodiments, the third wall 33 is in direct contact with the base substrate 10. The third wall 33 forms a bottom of the microchannel 40. In some embodiments, the first wall 31, the second wall 32, and the third wall 33 include the same material. For example, they are formed in a single process using the same material by, for example, sputtering. In some embodiments, the third wall 33 includes a material different from that of the first wall 31 and the second wall 32. For example, the third wall 33 is firstly formed on the base substrate 10 using a first material by, for example, sputtering, and then the first wall 31 and the second wall 32 are formed using a second material by sputtering.

In some embodiments, the first wall 31 and the second wall 32 are at least partially separated from each other on a side of the microchannel 40 opposite to the third wall 33. For example, the microchannel 40 is at least partially open on the side opposite to the third wall 33. In some embodiments, the first wall 31 and the second wall 32 are separated from each other on the side of the microchannel 40 opposite to the third wall 33 over the entire length of the microchannel 40 in the extension direction E along a plane substantially parallel to the main surface S of the base substrate 10. For example, the microchannel 40 is a microgroove. In some embodiments, the first wall 31 and the second wall 32 are separated from each other on the side of the microchannel 40 opposite to the third wall 33 over one or more first portions of the length of the microchannel 40 in the extension direction E along a plane substantially parallel to the main surface S of the base substrate 10, and the first wall 31 and the second wall 32 are connected to each other on the side of the microchannel 40 opposite to the third wall 33 over one or more second portions of the length of the microchannel 40 in the extension direction E along a plane substantially parallel to the main surface S of the base substrate 10.

In some embodiments, the first wall 31 and the second wall 32 are connected to each other on the side of the microchannel 40 opposite to the third wall 33. In some embodiments, the microchannel 40 is substantially closed on the side opposite to the third wall 33, for example, the microchannel 40 is a microcapillary. In some embodiments, the first wall 31 and the second wall 32 are connected to each other on the side of the microchannel 40 opposite to the third wall 33 over the entire length of the microchannel 40 in the extension direction E along a plane substantially parallel to the main surface S of the base substrate 10. In some embodiments, the first wall 31 and the second wall 32 are connected to each other on the side of the microchannel 40 opposite to the third wall 33 over one or more first portions of the length of the microchannel 40 in the extension direction E along a plane substantially parallel to the main surface S of the base substrate 10, and the first wall 31 and the second wall 32 are separated from each other on the side of the microchannel 40 opposite to the third wall 33 over one or more second portions of the length of the microchannel 40 in the extension direction E along the plane substantially parallel to the main surface S of the base substrate 10.

In some embodiments, the wall layer structure does not include the third wall, and the microchannel 40 is adjacent to the base substrate 10. For example, the base substrate 10 forms a bottom of the microchannel 40. FIG. 2B is a sectional view of a microchannel structure according to some embodiments of the present disclosure. Referring to FIG. 2B, in some embodiments, the wall layer does not include a third wall. The base substrate 10 constitutes the bottom of the microchannel 40. The microchannel 40 is adjacent to the base substrate 10.

Figure 2C:
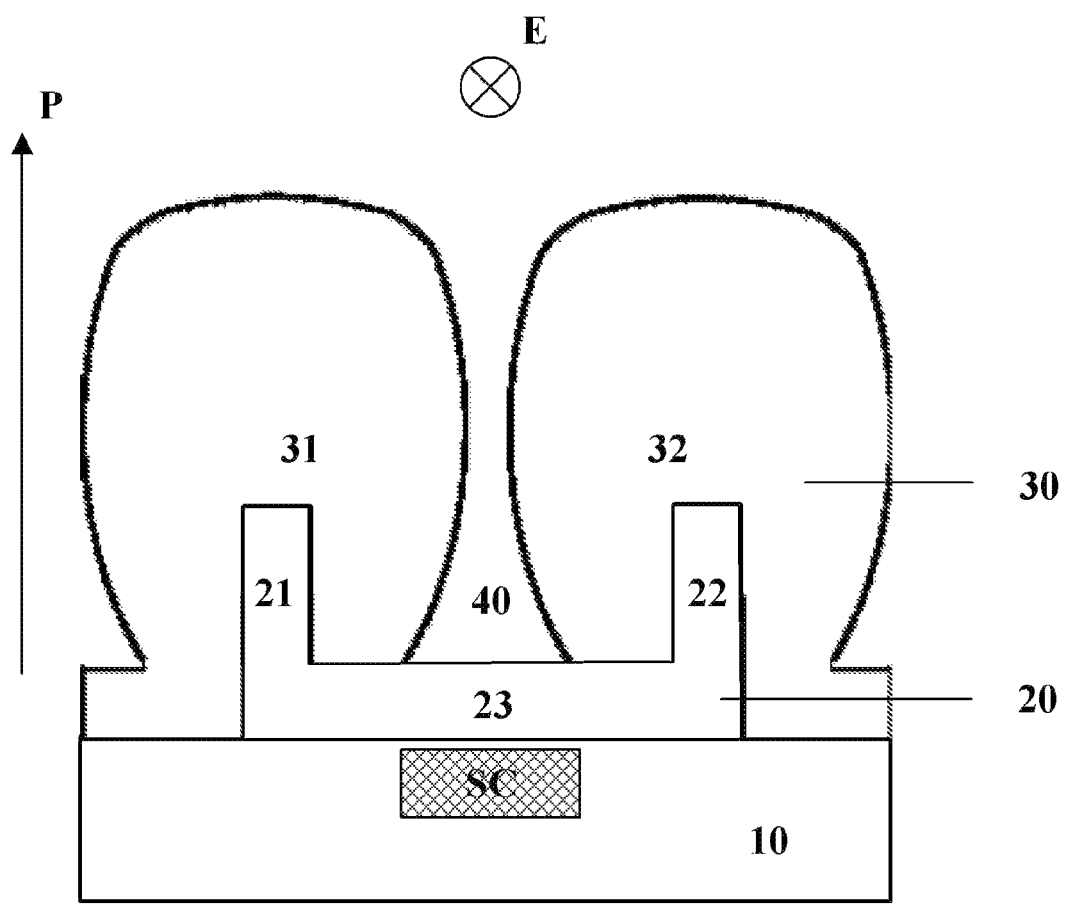
FIG. 2C is a sectional view of a microchannel structure according to some embodiments of the present disclosure.
Figure 3:
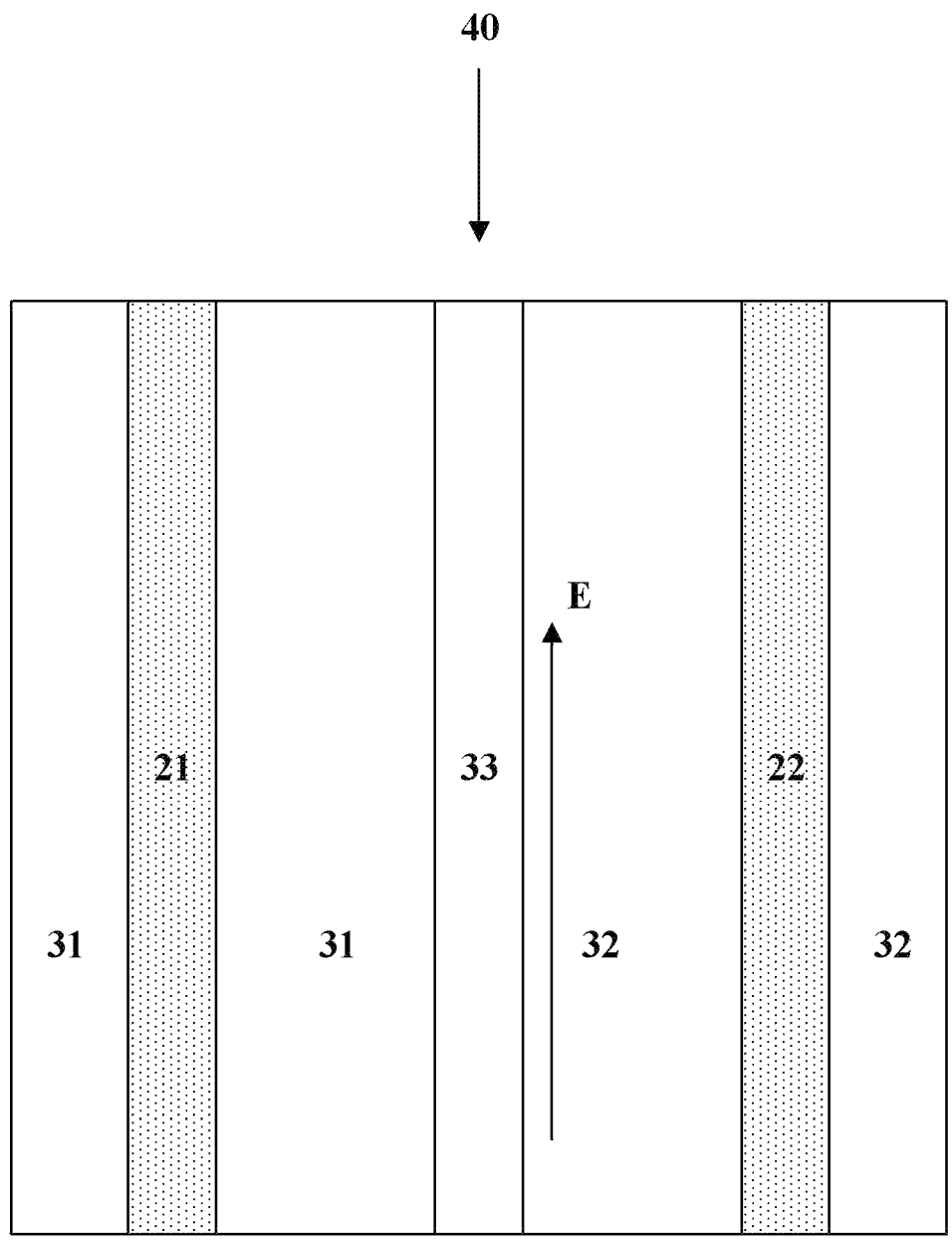
FIG. 3 is a sectional view taken along the line A-A' in FIG. 1.

FIG. 2C is a sectional view of a microchannel structure according to some embodiments of the present disclosure. Referring to FIG. 2C, in some embodiments, the track layer 20 comprises a first track 21 and a second track 22 spaced apart from each other, and a base portion 23 connecting the first track 21 and the second track 22. The section of the track layer 20 along a plane perpendicular to the extension direction E is U-shaped. As shown in FIG. 2C, in some embodiments, the wall layer does not include a third wall. The base portion 23 constitutes a bottom of the microchannel 40. The microchannel 40 is adjacent to the base portion 23.

Various suitable track layer materials and various appropriate manufacturing methods can be used to form a track layer. For example, a track layer material may be formed on the substrate by a photolithography process, an electron beam lithography process, nanoimprint lithography, an etching process (e.g. dry etching), a thermal etching process, or a combination thereof. An example of the material suitable for fabricating a track layer includes, but is not limited to, an insulating material, a semiconductor material, a conductive material, or a combination thereof. Depending on an application scenario, the track layer may be conductive, semi-conductive, or insulating.

Various suitable wall layer materials and various appropriate manufacturing methods can be used to form a wall layer. For example, a wall layer material may be deposited on a substrate by sputtering. An example of the material suitable for fabricating the wall layer includes, but is not limited to, an insulating material, a semiconductor material, a conductive material, or a combination thereof. Depending on the application scenario, the wall layer may be made to be conductive, semi-conductive, or insulating.

In some embodiments, the material forming the wall layer is a sputtering target material, and the target material includes, but is not limited to, various semiconductor materials such as oxides, nitrides, and silicon.

In some embodiments, the track layer includes a material different from that of the wall layer. In some embodiments, the track layer and the wall layer are made of the same material.

Depending on the desired function of the microchannel structure in a device having the microchannel structure, various suitable materials may be selected to fabricate each of the wall layer 30, the track layer 20 and the base substrate 10 based on physical and chemical characteristics desired for the function of the microchannel structure. Suitable materials include, but are not limited to, polymeric materials such as silicone polymers (e.g., polydimethylsiloxane and epoxy polymers), polyimides (e.g., Kapton® (poly(4,4'-oxydiphenylene-pyrimellitic acid)) commercially available from DuPont, Wilmington, Del. and Upilex™ (poly(biphenyltetracarboxylic dianhydride)) commercially available from Ube Industries, Japan), polycarbonates, polyesters, polyamides, polyethers, polyurethanes, polyfluorocarbons, fluorinated polymers (e.g., polyvinyl fluoride, polyvinylidene fluoride, polytetrafluoroethylene, polychlorotrifluoroethylene, perfluoroalkoxy polymers, fluoroethylene-propylene, polyethylene tetrafluoroethylene, polyethylene trifluorochloroethylene, perfluoropolyether, perfluorosulfonic acid, perfluoropolyoxetane alkane, FFPM/FFKM (perfluorinated elastomer [perfluoroelastomer]), FPM/FKM (fluorocarbon [trifluorochloroethylene vinylidene fluoride]), and their copolymers), polyetheretherketone (PEEK), polystyrene, poly (acrylonitrile butadiene-styrene) (ABS), acrylate and acrylic polymers (such as polymethyl methacrylate), and other substituted and unsubstituted polyolefins (for example, cycloolefin polymers, polypropylene, polybutene, polyethylene (PE, for example, cross-linked PE, high density PE, medium density PE, linearly low density PE, low density PE, or ultra-high molecular weight PE), polymethylpentene, polybutene-1, polyisobutylene, ethylene propylene rubber, ethylene propylene diene monomer (M grade) rubber), and their copolymers (e.g., cycloolefin copolymers); ceramics, such as alumina, silicon oxide, zirconia, etc.; semiconductors, such as silicon, gallium arsenide, etc.; oxide semiconductors (such as ITO, ZnO, IGZO, IZO, SnO, etc.); glass; metal; and coating compositions, composites (e.g., a bulk composite of any of the materials described herein, such as a A-B-A bulk composite, a A-B-C bulk composite, etc.), and laminates thereof (e.g., composite materials formed from several different adhesive layers made of the same or different materials, such as polymer laminates or polymer-metal laminates (for example, polymers coated with copper, ceramics in metal, or polymer composites in metal).

In some embodiments, the base substrate on which the microchannel structure is to be formed is a base substrate on which an electrode structure is formed before the microchannel structure is formed. For example, the base substrate is a substrate having an electrode structure of a sensor (including a sensing circuit). Subsequently, the microchannel structure is formed on the base substrate. In some embodiments, the track layer is made of a conductive material. In some embodiments, the first track and the second track are two electrodes of the sensor (e.g., they are connected to the sensing circuit in the base substrate). The electrodes (e.g., the first track and the second track) of the sensor are configured to detect chemical and/or biological signals in the microchannel.

Referring to FIG. 1, in some embodiments, the microchannel structure is part of a biochemical sensor. A fluid (e.g., a liquid or a gas or a combination thereof) flows through the microchannel 40. A sensing circuit SC is formed in the base substrate 10, and the first track 21 and the second track 22 act as sensing electrodes for detecting chemical and/or biological signals in a liquid.

Referring to FIG. 2A, in some embodiments, the microchannel structure is part of a gas sensor for detecting a gas. Due to the presence of the microchannel structure, the gas sensor has a large surface area for absorbing target gas molecules, and thus can be very highly sensitive. The microchannel 40 is open on a side opposite to the base substrate 10, and a gas can flow into the microchannel 40 through the opening. The inner surface of the microchannel 40 absorbs target gas molecules. A sensing circuit SC is formed on the base substrate 10, and the first track 21 and the second track 22 are sensing electrodes for detecting target gas molecules absorbed on the inner surface of the microchannel 40.

The base substrate 10 may comprise an integrated circuit, a device structure, and the like. That is, the technical solution provided by the present disclosure can realize fabrication of a microchannel structure based on a device that has been fabricated.

The microchannel structure may be attached to, combined with, and integrated into various suitable devices and apparatuses, or used in various suitable devices and apparatuses in other manners. In some embodiments, the microchannel structure is a microchannel structure in a microfluidic device. In some embodiments, the microchannel structure is a microchannel structure in a sensor (e.g., a biochemical sensor). In some embodiments, the microchannel structure is a microchannel structure in a lab-on-chip device. In some embodiments, the microchannel structure is a microchannel structure in a gene sequencing device. As used herein, the term "microfluidic device" refers to a small device that controls, operates, and detects fluids at a microscopic scale. As used herein, the term "lab-on-chip device" refers to an integrated chip on which various scientific operations (e.g., reaction, separation, purification and detection) of a sample solution can be performed simultaneously. Ultra-high-sensitivity analysis, ultra-micro-analysis, or ultra-flexible simultaneous multi-item analysis can be performed by means of the lab-on-chip device. An example of the lab-on-chip device is a chip having a protein generation unit, a protein purification unit, and a protein detection unit connected to each other via microchannels.

The microchannel structure may be a microchannel structure in various suitable sensors, such as a gas sensor, a deoxyribonucleic acid (DNA) sensor, a ribonucleic acid (RNA) sensor, a peptide or protein sensor, an antibody sensor, an antigen sensor, a tissue factor sensor, a carrier and virus vector sensor, a lipid and fatty acid sensor, a steroid sensor, a neurotransmitter sensor, an inorganic ion and electrochemical sensor, a pH sensor, a free radical sensor, a carbohydrate sensor, a neural sensor, a chemical sensor, a small molecule sensor, an exon sensor, a metabolite sensor, an intermediate sensor, a chromosome sensor, and a cell sensor.

In some embodiments, the section of the microchannel 40 along a plane substantially perpendicular to the extension direction has a sectional dimension between about 1 nm to about 1000 μm, for example, in a range of about 3 nm to about 30 μm, in a range of about 1 nm to about 25 nm, in a range of about 25 nm to about 50 nm, in a range of about 50 nm to about 75 nm, in a range of about 75 nm to about 100 nm, in a range of about 100 nm to about 250 nm, in a range of about 250 nm to about 500 nm, in a range of about 500 nm to about 750 nm, in a range of about 750 nm to about 1 μm, in a range of about 1 μm to about 10 μm, in a range of about 10 μm to about 100 μm, in a range of about 100 μm to about 200 μm, in a range of about 200 μm to about 400 μm, in a range of about 400 μm to about 600 μm, in a range of about 600 μm to about 800 μm, and in a range of about 800 μm to about 1000 μm.

In some embodiments, the microchannel 40 may have any suitable sectional shape, for example, U-shaped, D-shaped, rectangular, triangular, oval, oval-like, circular, semi-circular, square, trapezoidal, pentagonal, hexagonal and other sectional geometrical structures. The geometrical structure may be constant or may vary along the length of the microchannel. In addition, the microchannel may have any type of arrangement or configuration, including linear, non-linear, fused, branched, looped, twisted, stepped and other configurations. In some embodiments, the microchannel has an irregular sectional shape.

In some embodiments, the section of each of the first track 21 and the second track 22 along a plane substantially perpendicular to the extension direction has a sectional dimension between about 1 nm and about 1000 μm, for example, in a range of about 5 nm to about 50 μm, in a range of about 1 nm to about 25 nm, in a range of about 25 nm to about 50 nm, in a range of about 50 nm to about 75 nm, in a range of about 75 nm to about 100 nm, in a range of about 100 nm to about 250 nm, in a range of about 250 nm to about 500 nm, in a range of about 500 nm to about 750 nm, in a range of about 750 nm to about 1 μm, in a range of about 1 μm to about 10 μm, in a range of about 10 μm to about 100 μm, in a range of about 100 μm to about 200 μm, in a range of about 200 μm to about 400 μm, in a range of about 400 μm to about 600 μm, in a range of about 600 μm to about 800 μm, and in a range of about 800 μm to about 1000 μm.

Each of the first track 21 and the second track 22 may have any suitable sectional shape, for example, rectangular, triangular, oval, oval-like, circular, semi-circular, square, trapezoidal, pentagonal, hexagonal and other sectional geometrical structures. In some embodiments, the first track 21 and the second track 22 have an irregular sectional shape. The geometrical structure may be constant or may vary along the length of the microchannel. In addition, each of the first track 21 and the second track 22 may have any type of arrangement or configuration, including linear, non-linear, fused, branched, looped, twisted, stepped and other configurations.

In some embodiments, the section of each of the first wall 31, the second wall 32 and the third wall 33 along a plane substantially perpendicular to the extension direction has a sectional dimension between about 1 nm to about 1000 μm, for example, in a range of about 5 nm to about 50 μm, in a range of about 1 nm to about 25 nm, in a range of about 25 nm to about 50 nm, in a range of about 50 nm to about 75 nm, in a range of about 75 nm to about 100 nm, in a range of about 100 nm to about 250 nm, in a range of about 250 nm to about 500 nm, in a range of about 500 nm to about 750 nm, in a range of about 750 nm to about 1 μm, in a range of about 1 μm to about 10 μm, in a range of about 10 μm to about 100 μm, in a range of about 100 μm to about 200 μm, in a range of about 200 μm to about 400 μm, in a range of about 400 μm to about 600 μm, in a range of about 600 μm to about 800 μm, and in a range of about 800 μm to about 1000 μm.

Each of the first wall 31, the second wall 32 and the third wall 33 may have any suitable sectional shape, for example, rectangular, triangular, oval, oval-like, circular, semi-circular, square, trapezoidal, pentagonal, hexagonal and other sectional geometrical structures. In some embodiments, the first wall 31, the second wall 32, and the third wall 33 have an irregular sectional shape. The geometrical structure may be constant or may vary along the length of the microchannel. In addition, each of the first wall 31, the second wall 32 and the third wall 33 may have any type of arrangement or configuration, including linear, non-linear, fused, branched, looped, twisted, stepped and other configurations.

In some embodiments, a normal distance between the first track 21 and the second track 22 in a direction parallel to the main surface of the base substrate is in a range of about 10 nm to about 1000 μm, for example, in a range of about 10 nm to about 25 nm, in a range of about 25 nm to about 50 nm, in a range of about 50 nm to about 75 nm, in a range of about 75 nm to about 100 nm, in a range of about 100 nm to about 250 nm, in a range of about 250 nm to about 500 nm, in a range of about 500 nm to about 750 nm, in a range of about 750 nm to about 1 μm, in a range of about 1 μm to about 10 μm, in a range of about 10 μm to about 100 μm, in a range of about 100 μm to about 200 μm, in a range of about 200 μm to about 400 μm, in a range of about 400 μm to about 600 μm, in a range of about 600 μm to about 800 μm, and in a range of about 800 μm to about 1000 μm.

In some embodiments, a distance d between the first track 21 and the second track 22 may be greater than or equal to 5 nanometers and less than or equal to 50 micrometers. The height h of the first track 21 and the second track 22 may be greater than or equal to 5 nanometers and less than or equal to 50 microns.

In some embodiments, the ratio of the width of the section of the microchannel 40 perpendicular to the extension direction in a direction substantially parallel to the main surface of the base substrate to the normal distance between the first track 21 and the second track 22 in a direction parallel to the main surface of the base substrate is in a range of about 1:1.5 to about 1:100, for example, in a range of about 1:1.5 to about 1:2, in a range of about 1:2 to about 1:3, in a range of about 1:3 to about 1:4, in a range of about 1:4 to about 1:5, in a range of about 1:5 to about 1:6, in a range of about 1:6 to about 1:7, in a range of about 1:7 to about 1:8, in a range of about 1:8 to about 1:9, in a range of about 1:9 to about 1:10, in a range of about 1:10 to about 1:20, in a range of about 1:20 to about 1:30, in a range of about 1:30 to about 1:40, in a range of about 1:40 to about 1:50, in a range of about 1:50 to about 1:60, in a range of about 1:60 to about 1:70, in a range of about 1:70 to about 1:80, in a range of about 1:80 to about 1:90, and in a range of about 1:90 to about 1:100. In some embodiments, the ratio of the width of the section of the microchannel 40 perpendicular to the extension direction in a direction substantially parallel to the main surface of the base substrate to the normal distance between the first track 21 and the second track 22 in a direction parallel to the main surface of the base substrate is in a range of about 1:2 to about 1:10, for example, in a range of about 1:3 to about 1:4.

In some embodiments, the ratio of the width of the section of the microchannel 40 perpendicular to the extension direction in a direction substantially parallel to the main surface of the base substrate to the width of the section of the third wall 33 perpendicular to the extension direction in a direction substantially parallel to the main surface of the base substrate is in a range of about 1:1.5 to about 1:100, for example, in a range of about 1:1.5 to about 1:2, in a range of about 1:2 to about 1:3, in a range of about 1:3 to about 1:4, in a range of about 1:4 to about 1:5, in a range of about 1:5 to about 1:6, in a range of about 1:6 to about 1:7, in a range of about 1:7 to about 1:8, in a range of about 1:8 to about 1:9, in a range of about 1:9 to about 1:10, in a range of about 1:10 to about 1:20, in a range of about 1:20 to about 1:30, in a range of about 1:30 to about 1:40, in a range of about 1:40 to about 1:50, in a range of about 1:50 to about 1:60, in a range of about 1:60 to about 1:70, in a range of about 1:70 to about 1:80, in a range of about 1:80 to about 1:90, and in a range of about 1:90 to about 1:100. In some embodiments, the ratio of the width of the section of the microchannel 40 perpendicular to the extension direction in a direction substantially parallel to the main surface of the base substrate to the width of the section of the third wall 33 perpendicular to the extension direction in a direction substantially parallel to the main surface of the base substrate is in a range of about 1:2 to about 1:10, for example, in a range of about 1:3 to about 1:4.

In some embodiments, the ratio of the width of the section of the microchannel 40 perpendicular to the extension direction in a direction substantially parallel to the main surface of the base substrate to the width of the section of the first wall 31 perpendicular to the extension direction in a direction substantially parallel to the main surface of the base substrate is in a range of about 1:1.5 to about 1:100, for example, in a range of about 1:1.5 to about 1:2, in a range of about 1:2 to about 1:3, in a range of about 1:3 to about 1:4, in a range of about 1:4 to about 1:5, in a range of about 1:5 to about 1:6, in a range of about 1:6 to about 1:7, in a range of about 1:7 to about 1:8, in a range of about 1:8 to about 1:9, in a range of about 1:9 to about 1:10, in a range of about 1:10 to about 1:20, in a range of about 1:20 to about 1:30, in a range of about 1:30 to about 1:40, in a range of about 1:40 to about 1:50, in a range of about 1:50 to about 1:60, in a range of about 1:60 to about 1:70, in a range of about 1:70 to about 1:80, in a range of about 1:80 to about 1:90, and in a range of about 1:90 to about 1:100. In some embodiments, the ratio of the width of the section of the microchannel 40 perpendicular to the extension direction in a direction substantially parallel to the main surface of the base substrate to the width of the section of the first wall 31 perpendicular to the extension direction in a direction substantially parallel to the main surface of the base substrate is in a range of about 1:2 to about 1:10, for example, in a range of about 1:3 to about 1:4.

In some embodiments, the ratio of the width of the section of the microchannel 40 perpendicular to the extension direction in a direction substantially parallel to the main surface of the base substrate to the width of the section of the second wall 32 perpendicular to the extension direction in a direction substantially parallel to the main surface of the base substrate is in a range of about 1:1.5 to about 1:100, for example, in a range of about 1:1.5 to about 1:2, in a range of about 1:2 to about 1:3, in a range of about 1:3 to about 1:4, in a range of about 1:4 to about 1:5, in a range of about 1:5 to about 1:6, in a range of about 1:6 to about 1:7, in a range of about 1:7 to about 1:8, in a range of about 1:8 to about 1:9, in a range of about 1:9 to about 1:10, in a range of about 1:10 to about 1:20, in a range of about 1:20 to about 1:30, in a range of about 1:30 to about 1:40, in a range of about 1:40 to about 1:50, in a range of about 1:50 to about 1:60, in a range of about 1:60 to about 1:70, in a range of about 1:70 to about 1:80, in a range of about 1:80 to about 1:90, and in a range of about 1:90 to about 1:100. In some embodiments, the ratio of the width of the section of the microchannel 40 perpendicular to the extension direction in a direction substantially parallel to the main surface of the base substrate to the width of the section of the second wall 32 perpendicular to the extension direction in a direction substantially parallel to the main surface of the base substrate is in a range of about 1:2 to about 1:10, for example, in a range of about 1:3 to about 1:4.

In some embodiments, the ratio of the height of the section of the first track 21 perpendicular to the extension direction in the protruding direction to the height of the section of the first wall 31 perpendicular to the extension direction in the protruding direction is in a range of about 1:1.5 to about 1:100, for example, in a range of about 1:1.5 to about 1:2, in a range of about 1:2 to about 1:3, in a range of about 1:3 to about 1:4, in a range of about 1:4 to about 1:5, in a range of about 1:5 to about 1:6, in a range of about 1:6 to about 1:7, in a range of about 1:7 to about 1:8, in a range of about 1:8 to about 1:9, in a range of about 1:9 to about 1:10, in a range of about 1:10 to about 1:20, in a range of about 1:20 to about 1:30, in a range of about 1:30 to about 1:40, in a range of about 1:40 to about 1:50, in a range of about 1:50 to about 1:60, in a range of about 1:60 to about 1:70, in a range of about 1:70 to about 1:80, in a range of about 1:80 to about 1:90, and in a range of about 1:90 to about 1:100. In some embodiments, the ratio of the height of the section of the first track 21 perpendicular to the extension direction in the protruding direction to the height of the section of the first wall 31 perpendicular to the extension direction in the protruding direction is in a range of about 1:2 to about 1:10, for example, in a range of about 1:3 to about 1:4.

In some embodiments, the ratio of the height of the section of the second track 22 perpendicular to the extension direction in the protruding direction to the height of the section of the second wall 32 perpendicular to the extension direction in the protruding direction is in a range of about 1:1.5 to about 1:100, for example, in a range of about 1:1.5 to about 1:2, in a range of about 1:2 to about 1:3, in a range of about 1:3 to about 1:4, in a range of about 1:4 to about 1:5, in a range of about 1:5 to about 1:6, in a range of about 1:6 to about 1:7, in a range of about 1:7 to about 1:8, in a range of about 1:8 to about 1:9, in a range of about 1:9 to about 1:10, in a range of about 1:10 to about 1:20, in a range of about 1:20 to about 1:30, in a range of about 1:30 to about 1:40, in a range of about 1:40 to about 1:50, in a range of about 1:50 to about 1:60, in a range of about 1:60 to about 1:70, in a range of about 1:70 to about 1:80, in a range of about 1:80 to about 1:90, and in a range of about 1:90 to about 1:100. In some embodiments, the ratio of the height of the section of the second track 22 perpendicular to the extension direction in the protruding direction to the height of the section of the second wall 32 perpendicular to the extension direction in the protruding direction is in a range of about 1:2 to about 1:10, for example, in a range of about 1:3 to about 1:4.

Various implementations of the microchannel structure may be practiced. In some embodiments, the present disclosure provides a thin film transistor comprising a substrate, and a source, a drain, and an active layer disposed on the substrate. The active layer comprises a first portion and a second portion on the source and the drain respectively, and the first portion and the second portion are at least partially spaced apart to form a microchannel between the first portion and the second portion. A sample may be placed in or pass through the microchannel of the thin film transistor, so that detection of the sample in the microchannel can be achieved.

Figure 12:
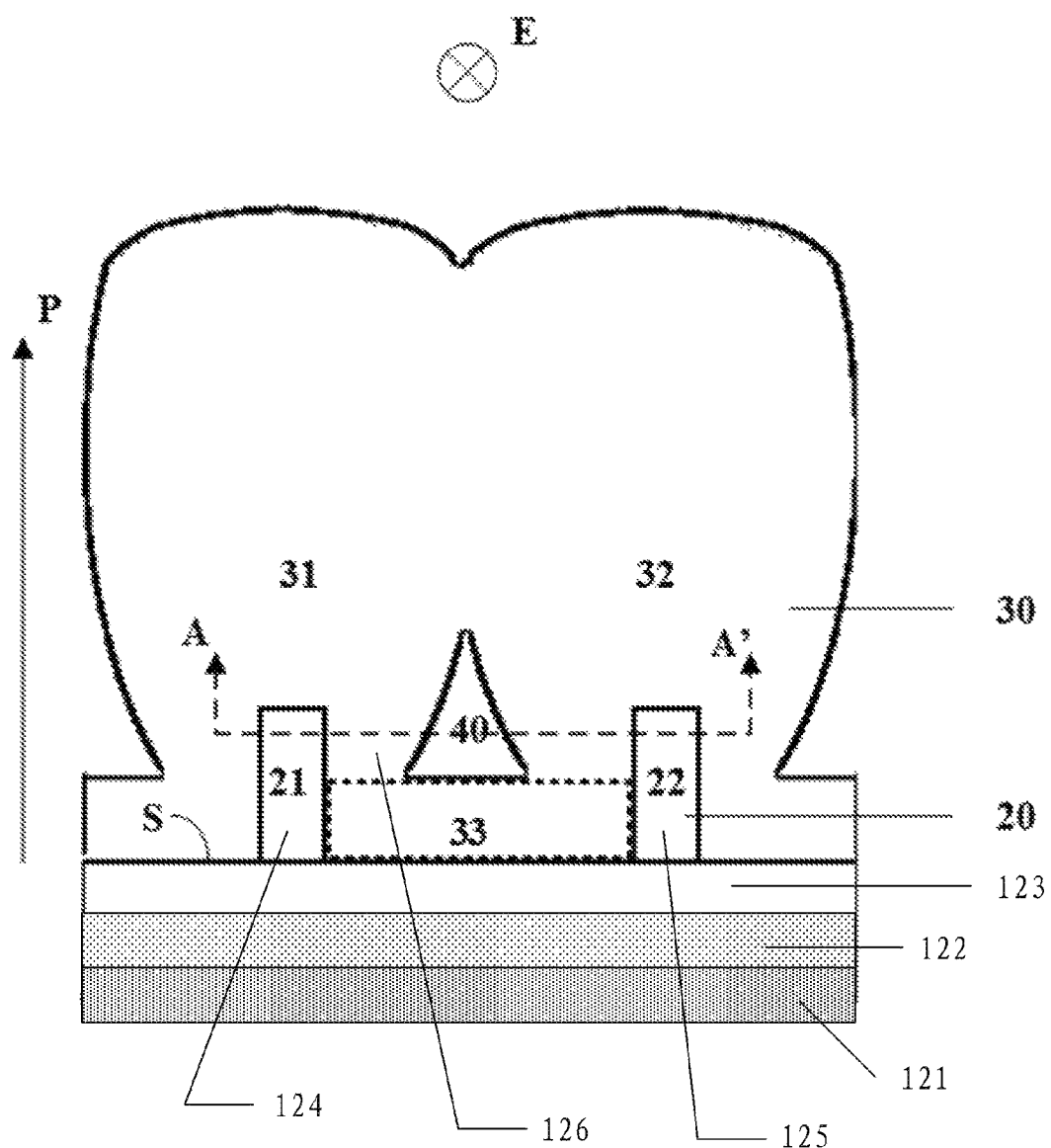
FIG. 12 is a sectional view of a thin film transistor according to some embodiments of the present disclosure.

FIG. 12 is a sectional view of a thin film transistor according to some embodiments of the present disclosure. Referring to FIG. 12, a gate 122, a gate insulating layer, a source 124, a drain 125, and an active layer 126 are disposed on a substrate 121, and the gate 122 is close to the substrate 121. In this case, at least a part of the gate insulating layer 123 forms a bottom surface of the microchannel.

As an application of the microchannel structure provided by the foregoing embodiments, the thin film transistor provided by the embodiment may comprise the microchannel structure described in any of the foregoing embodiments. For example, the substrate 121 as well as the gate 122 and the gate insulating layer 123 disposed on the substrate 121 successively in a stacked manner can be used as the base substrate 10, the first track 21 and the second track 22 in the track layer 20 serve as the source 124 and the drain 125, respectively, and the active layer 126 may include the wall layer 30.

Specifically, the active layer 126 may comprise a first portion 31 (corresponding to the first wall in the foregoing embodiments) and a second portion 32 (corresponding to the second wall in the foregoing embodiments). The first portion 31 and the second portion 32 form a microchannel 40 closed on a side opposite to the substrate 121. The microchannel 40 extends in an extension direction along a plane substantially parallel to the main surface of the substrate 121, and the extension direction is substantially parallel to an extension direction of the source 124 and the drain 125 along a plane substantially parallel to the main surface of the substrate 121.

In the example of FIG. 12, the first portion 31 and the second portion 32 of the active layer extend in a vertical direction facing away the main surface of the substrate 121, respectively, and the area of the cross section of each of the first portion 31 and the second portion 32 parallel to the main surface of the substrate gradually increases in the vertical direction, so that the top of the first portion and the top of the second portion are connected to each other, enabling the microchannel to form a top-closed channel structure.

An orthographic projection of the first portion 31 on the substrate 121 substantially covers an orthographic projection of the source 124 on the substrate 121, and an orthographic projection of the second portion 32 on the substrate 121 substantially covers an orthographic projection of the drain 125 on the substrate 121.

The active layer 126 may further comprise a third portion 33 connecting the source 124 and the drain 125. The third portion 33 is in direct contact with the gate insulating layer 123 and serves as a bottom of the microchannel.

A distance d between the source 124 and the drain 125 may be, for example, greater than or equal to 5 nm and less than or equal to 50 μm. The source 124 and the drain 125 both have a height h of being greater than or equal to 5 nm and less than or equal to 50 μm.

It is to be noted that a thin film transistor of a bottom gate structure is taken as an example here for description, and the thin film transistor may also be of a top gate structure, that is, the gate insulating layer and the gate may be located above the active layer, which is not limited in this embodiment. In addition, the microchannel 40 shown in FIG. 12 is closed, and may also be open in practical applications, which is not limited in this embodiment.

The gate 122, as a control terminal of the thin film transistor, may be made of a material with good conductivity, such as low resistance oxides such as metals and ITO, semiconductor materials such as highly doped Si, and organic materials such as conductive adhesive. The source 124 and the drain 125 may be made of a metal material with good conductivity. The active layer made of a semiconductor material forms a closed microchannel 40. When a liquid to be detected enters the semiconductor active layer, i.e. the microchannel 40, it will affect the electron distribution in the active layer and cause fluctuations in the TFT characteristics. By detecting the fluctuations of the TFT characteristics, an effect of detecting the composition and property of the liquid to be detected can be achieved, and functions such as protein detection and gene sequencing can be realized. The thin film transistor provided by the embodiment of the present disclosure combines the detection function of a TFT with the advantages of micro-nano fluidic accurate measurement. By virtue of the microchannel, a sample therein can be precisely controlled. On the one hand, the impact of the external environment is reduced and the detection accuracy can be enhanced; on the other hand, continuous monitoring instead of one-time detection of a sample can be achieved and the sample detection efficiency can be improved.

In this technical solution, the distance between the source and the drain of the TFT and the sectional topography of the TFT are controllable, which can improve the detection accuracy of the device. At the same time, a step of dropping a sample is omitted, and the sample is allowed to flow in from the channel for the convenience of detection. Moreover, continuous detection instead of one-time detection of the sample can be achieved. Meanwhile, the closed active layer microchannel can greatly increase the contact area between the sample and the active layer. Meanwhile, the closed active layer microchannel can isolate the sample from external air and moisture, etc., which reduces the impact of the external environment on detection and further improves the detection accuracy.

Figure 13:
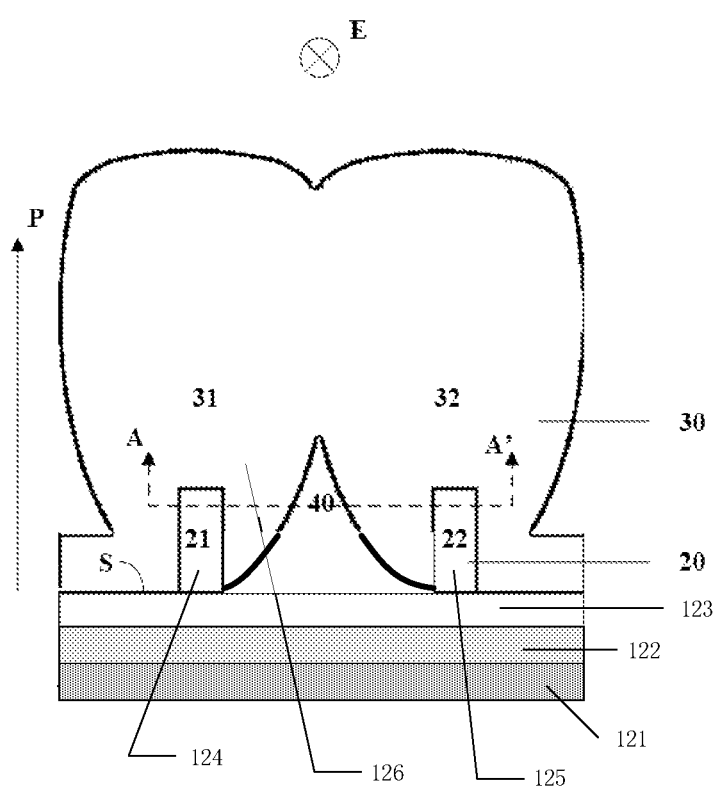
FIG. 13 is a sectional view of a thin film transistor according to some embodiments of the present disclosure.

FIG. 13 is a sectional view of a thin film transistor according to some embodiments of the present disclosure. As shown in FIG. 13, the active layer 126 does not have a third portion 33 connecting the source 124 and the drain 125, accordingly, at least a portion of the gate insulating layer 123 serves as a bottom of the microchannel 40.

Figure 6A:
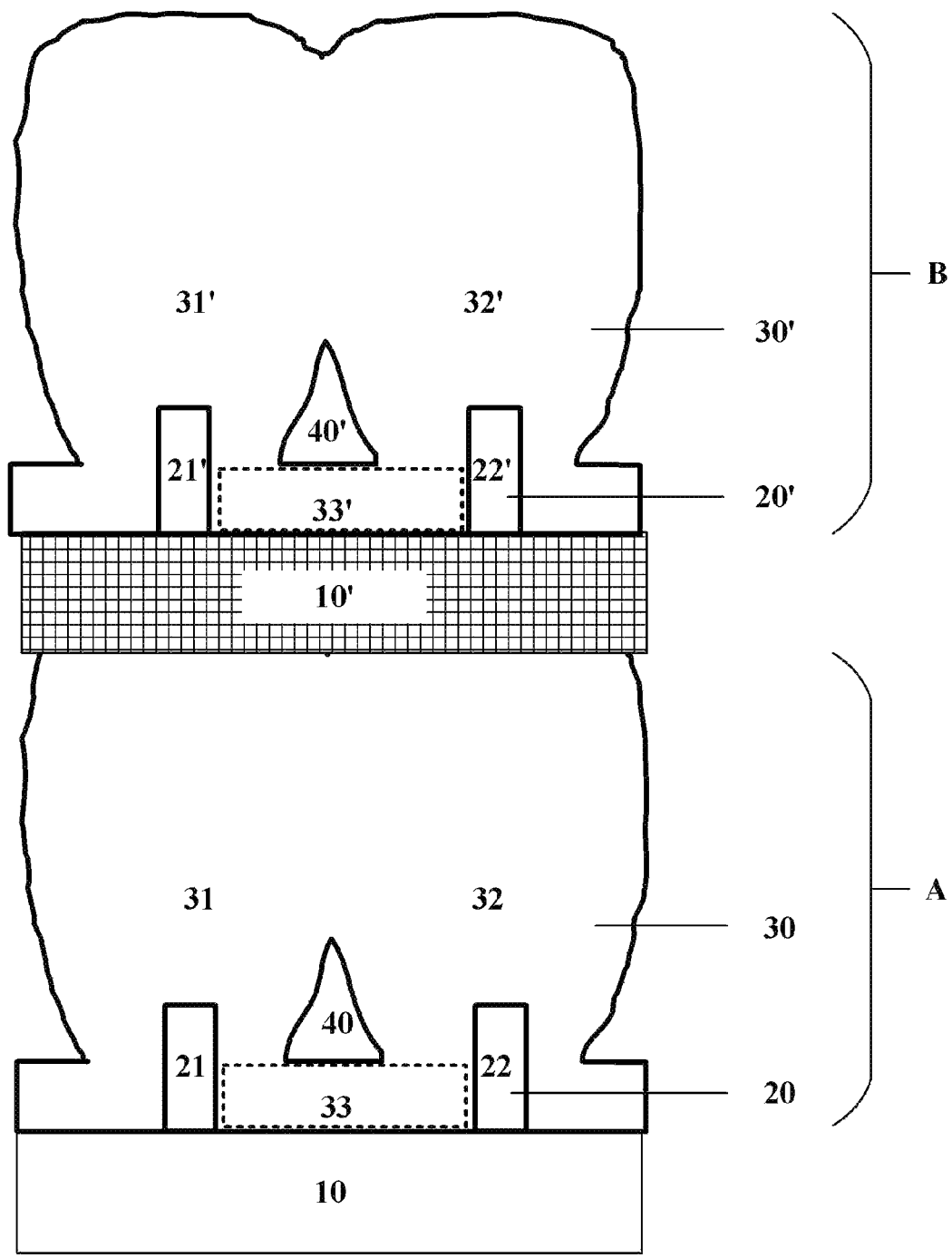
FIGS. 6A and 6B are sectional views of a multilayer microchannel structure according to some embodiments of the present disclosure.
Figure 6B:
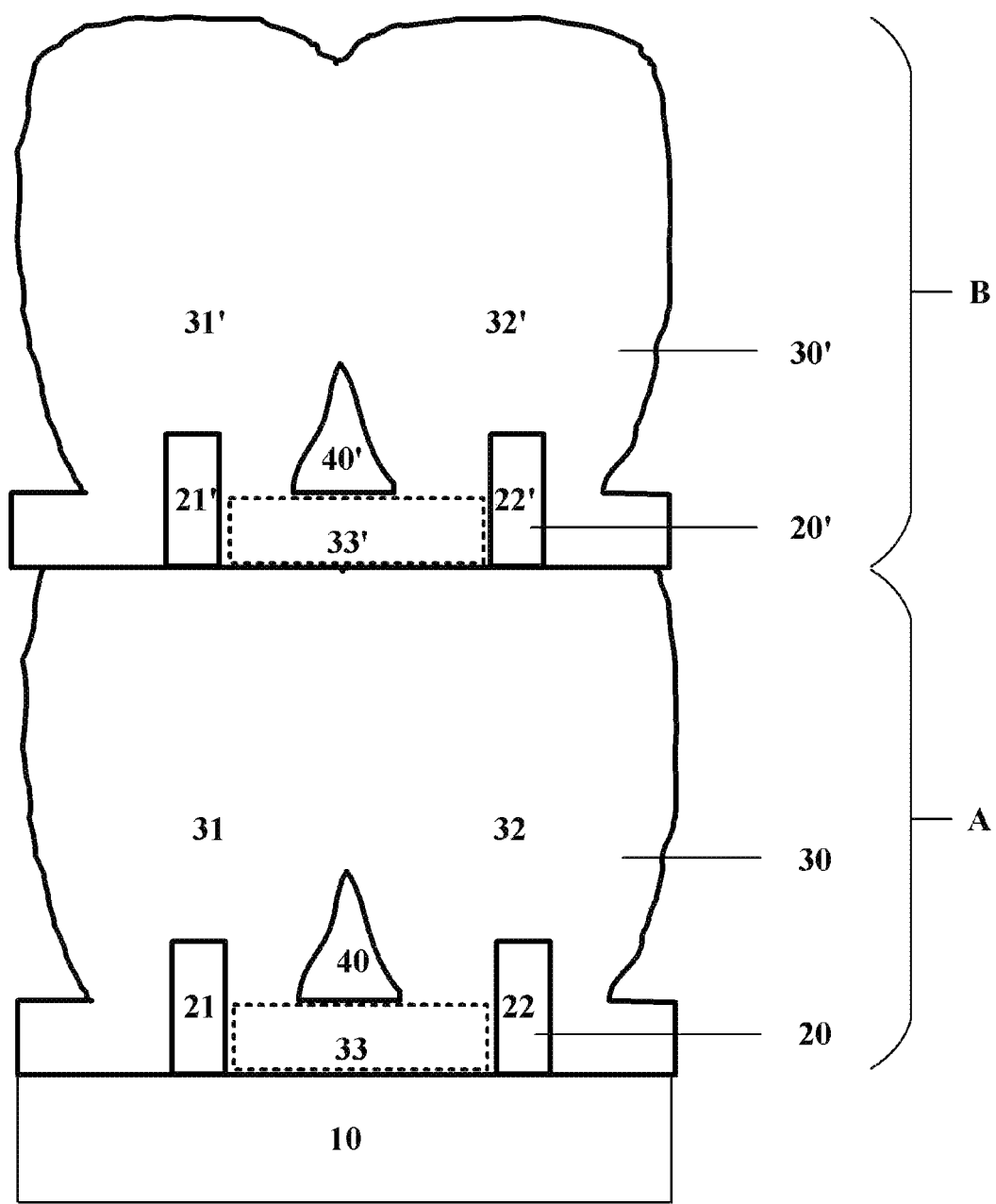

The thin film transistor disclosed by the present application may be applied to microelectronic devices, biochemical chip sensors such as micro/nano-fluidic devices, and the like. The sensor device disclosed by the present application may be directly fabricated on a structure such as an existing functional device, chip and circuit, which greatly reduces the difficulty of integrating the sensor with the functional chip. In some embodiments, the present disclosure provides a multilayer microchannel structure. FIGS. 6A to 6B are sectional views of a multilayer microchannel structure according to some embodiments of the present disclosure.

Referring to FIGS. 6A to 6B, the multilayer microchannel structure comprises a first layer A of the multilayer microchannel structure and a second layer B of the multilayer microchannel structure stacked on top of the first layer A. Each layer of the multilayer microchannel structure has a microchannel structure as described herein. For example, each layer of the multilayer microchannel structure may comprise any of the microchannel structures described in FIGS. 1, 2A, 2B and 2C.

In some embodiments, referring to FIG. 6A, the first layer A of the multilayer microchannel structure comprises: a base substrate 10; a track layer 20, which is located on the base substrate 10 and comprises a first track 21 and a second track 22 spaced apart from each other; a wall layer 30, which is located on a side of the track layer 20 facing away the base substrate 10 and has a first wall 31 and a second wall 32, the first wall 31 and the second wall 32 being at least partially spaced apart from each other, thereby forming a microchannel 40 between the first wall 31 and the second wall 32. The second layer B of the multilayer microchannel structure comprises: a second base substrate 10'; a second track layer 20', which is located on the second base substrate 10' and comprises a third track 21' and a fourth track 22' spaced apart from each other; a second wall layer 30', which is located on a side of the second track layer 20' facing away the second base substrate 10' and comprises a fourth wall 31' and a fifth wall 32', the fourth wall 31' and the fifth wall 32' being at least partially spaced apart from each other, thereby forming a second microchannel 40' between the fourth wall 31' and the fifth wall 32'. The extension direction of the microchannel 40 may be the same as that of the second microchannel 40'. In some embodiments, the extension direction of the microchannel 40 may be different from that of the second microchannel 40'. In some embodiments, the second base substrate 10' is a planarization layer.

In some embodiments, the multilayer microchannel structure does not comprise a planarization layer between the first layer A and the second layer B. Referring to FIG. 6B, a first layer A of the multilayer microchannel structure comprises: a base substrate 10; a track layer 20, which is located on the base substrate 10 and comprises a first track 21 and a second track 22 spaced apart from each other; a wall layer 30, which is located on a side of the track layer 20 facing away the base substrate 10 and comprises a first wall 31 and a second wall 32, the first wall 31 and the second wall 32 being at least partially spaced apart from each other, thereby forming a microchannel 40 between the first wall 31 and the second wall 32. The second layer B of the multilayer microchannel structure comprises: a second track layer 20', which is located on the wall layer 30 and has a third track 21' and a fourth track 22' spaced apart from each other; a second wall layer 30', which is located on a side of the second track layer 20' facing away the wall layer 30 and comprises a fourth wall 31' and a fifth wall 32', the fourth wall 31' and the fifth wall 32' being at least partially spaced apart from each other, thereby forming a second microchannel 40 ' between the fourth wall 31' and the fifth wall 32'. The extension direction of the microchannel 40 may be the same as that of the second microchannel 40'. In some embodiments, the extension direction of the microchannel 40 may be different from that of the second microchannel 40'. The wall layer 30 constitutes a second base substrate, on which the second layer B of the multilayer microchannel structure is formed.

In another aspect, the present disclosure provides a microfluidic device having a microchannel and electrodes integrated in the microfluidic device. Integrated electrodes (such as the first track 21 and the second track 22 shown in FIGS. 1, 2A to 2C) are capable of effectively detecting various physical and/or chemical parameters inside the microchannel 40. Examples of suitable parameters that can be measured by the integrated electrodes include: the resistance of the region between the two integrated electrodes in the microchannel 40, the voltage level on the region between the two integrated electrodes in the microchannel 40, the capacitance of the region between the two integrated electrodes in the microchannel 40, and so on. By measuring these parameters, the microfluidic device can efficiently detect biological and chemical molecules in the microchannel 40 and can be used in various related applications, such as gene sequencing.

The microfluids mentioned in the present disclosure are essentially micro-nano fluids, which may include microfluids on the order of micrometers, and may also include nano-fluids on the order of nanometers. Similarly, the microfluidic device is essentially a micro-nano fluidic device, which may include a microfluidic device on the order of micrometers and may also include a nanofluidic device on the order of nanometers.

In addition, the microfluidic device with integrated electrodes can be conveniently used as an active control device. Specifically, an external voltage or an external electric field may be applied to a region in the microchannel 40 between two integrated electrodes through the integrated electrodes, thereby effectively changing the electrochemical properties of the microchannel 40. In an example, the external voltage applied to the integrated electrodes may change the area size of an electrostatic repulsion region in the microchannel 40. In another example, the microfluidic device is a transport control device, and the integrated electrodes can control the transmission of a substance passing through the microchannel 40. For example, the integrated electrodes may be configured to control the microchannel 40 so that only molecules having a molecular weight within a specific range can pass through, thereby filtering out or enriching the target substance. In an example, the microfluidic device is a filter. In another example, the microfluidic device is a separator configured to separate molecules from each other. In another example, the microfluidic device is a concentrator configured to purify specific molecules.

In some embodiments, the microfluidic device comprises a control electrode (e.g., gate). In some embodiments, the track layer constitutes a control electrode of the microfluidic device to control the transport of a substance (e.g., a nucleic acid molecule such as DNA) passing through the microchannel. Referring to FIG. 2C, in some embodiments, the track layer 20 comprises a first track 21 and a second track 22 spaced apart from each other, and a base portion 23 connecting the first track 21 and the second track 22. The section of the track layer 20 along a plane perpendicular to the extension direction E is U-shaped. In some embodiments, the U-shaped track layer is used as a control electrode of the microfluidic device. By disposing a U-shaped control electrode, the electric field generated by the control electrode is greatly enhanced, and the intensity and uniformity of the electric field distributed throughout the microchannel 40 are improved. As a result, the performance of the microfluidic device can be greatly improved compared with a conventional microfluidic device. Currently, microfluidic devices have many applications in microfluidic technology, examples of which include: ion valves, molecular valves, electrically controlled microfluidic devices, light-controlled microfluidic devices, ion transistors, and so on.

Figure 7A:
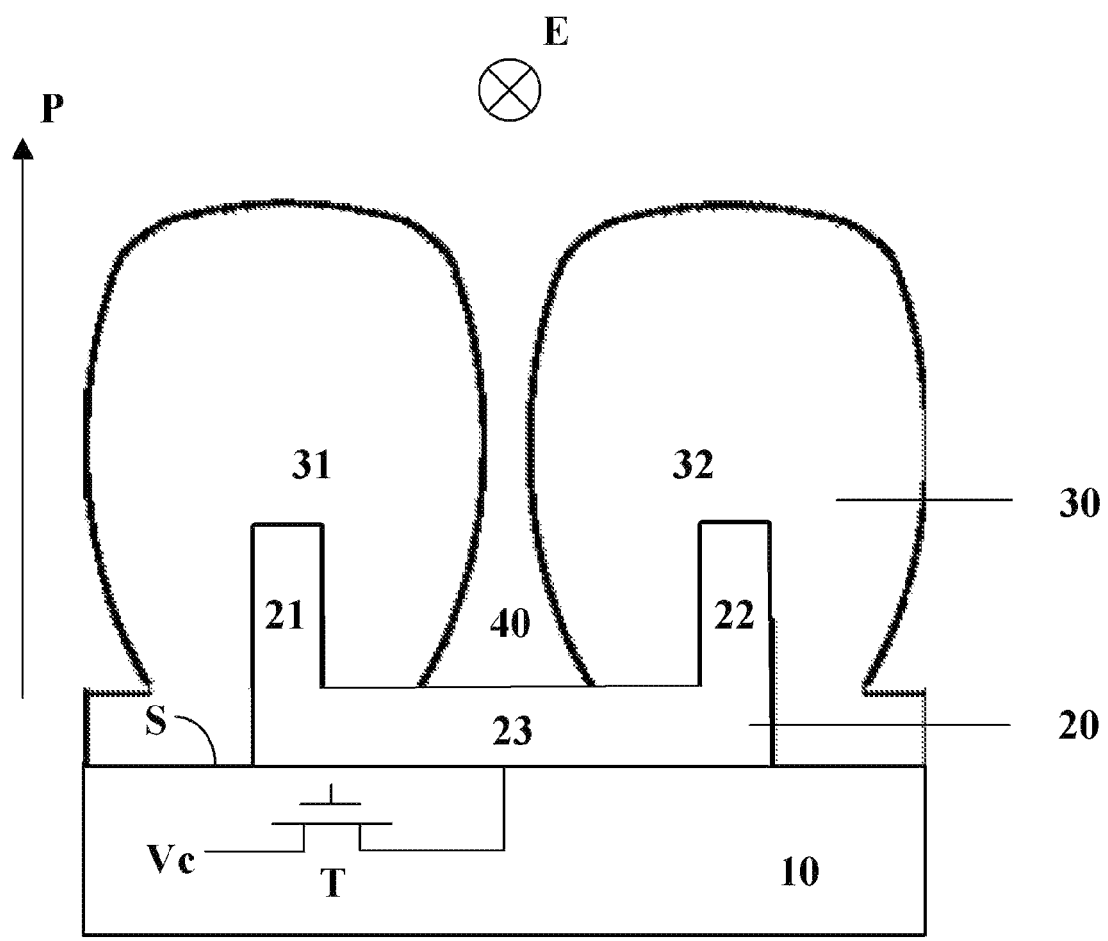
FIGS. 7A and 7B are schematic views of a microfluidic device according to some embodiments of the present disclosure.
Figure 7B:
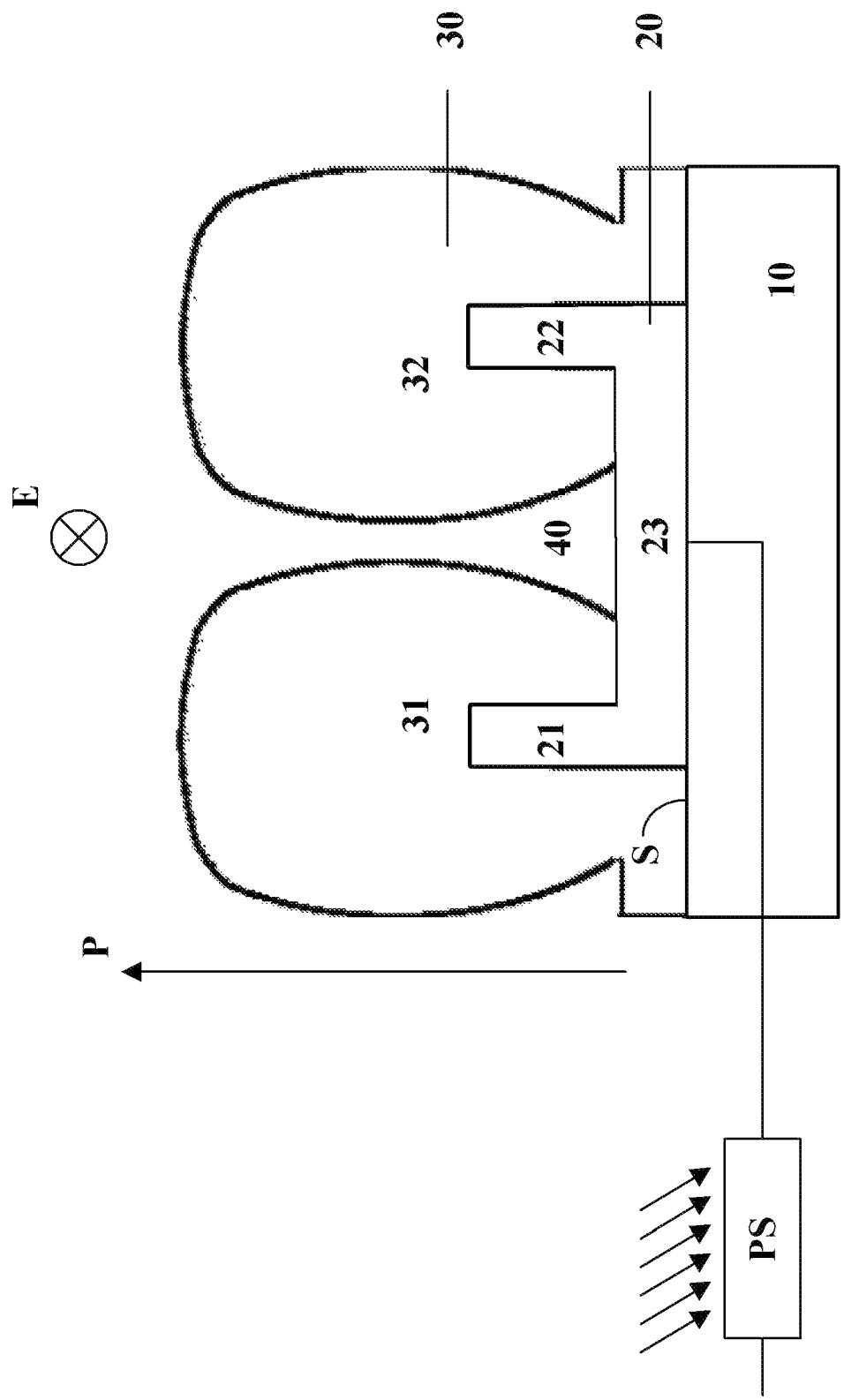

FIGS. 7A and 7B are schematic views of a microfluidic device according to some embodiments of the present disclosure. Referring to FIG. 7A, in some embodiments, the microfluidic device is an electrically controlled microfluidic device having a transistor T electrically connected to the track layer 20 of the microchannel structure. The transistor T is electrically connected to a control voltage Vc. When the transistor T is turned on, the control voltage Vc is transmitted to the track layer 20. In some embodiments, as described above, the microchannel structure is for controlling the transport of a substance passing through the microchannel 40, and the track layer 20 serves as a control electrode of a microchannel control device. By transmitting the control signal Vc to the track layer 20, the transport of a substance in the microchannel 40 can be electrically controlled.

Referring to FIG. 7B, in some embodiments, the microfluidic device is a light-controlled microfluidic device having a light sensor PS electrically connected to the track layer 20. When the light sensor PS is irradiated, it generates a photovoltage signal, which is transmitted to the track layer 20. In some embodiments, as described above, the microchannel structure is a microchannel structure for controlling the transport of a substance passing through the microchannel 40, and the track layer 20 acts as a control electrode of a microchannel control device. By transmitting a photovoltage signal to the track layer 20, it is possible to optically control the transport of a substance in the microchannel 40.

Figure 8:
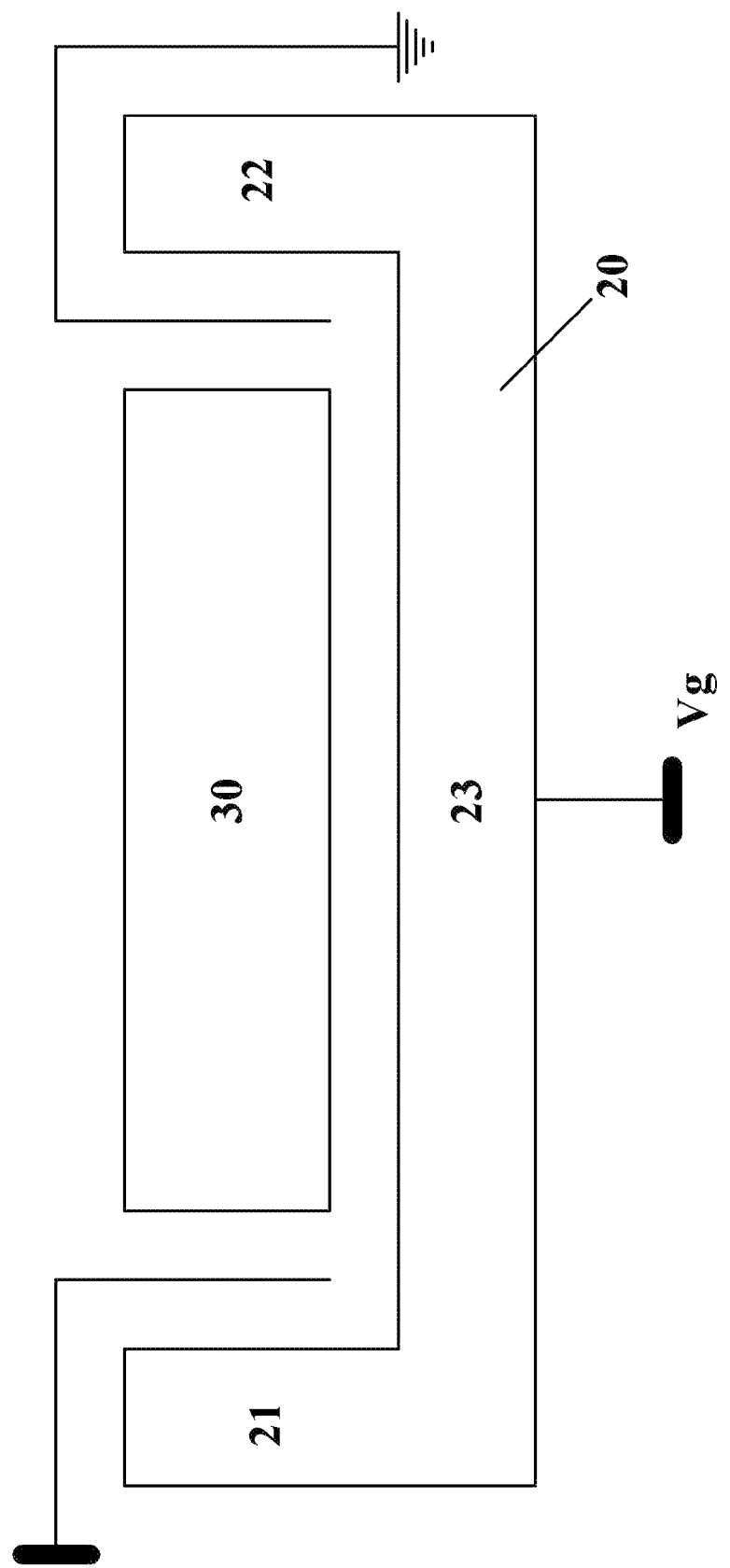
FIG. 8 is a view illustrating the structure of an ion transistor having a microchannel according to some embodiments of the present disclosure.

In some embodiments, the microfluidic device is an ion transistor. FIG. 8 is a view illustrating the structure of an ion transistor having a microchannel according to some embodiments of the present disclosure. Referring to FIG. 8, the track layer 20 functions as the gate of the ion transistor and is electrically connected to a gate driving signal Vg. Referring to FIG. 8, in some embodiments, the track layer 20 comprises a first track 21 and a second track 22 spaced apart from each other, and a base portion 23 connecting the first track 21 and the second track 22. The section of the track layer 20 along a plane perpendicular to the extension direction is U-shaped. In some embodiments, the U-shaped track layer is used as the gate of the ion transistor.

Figure 9:
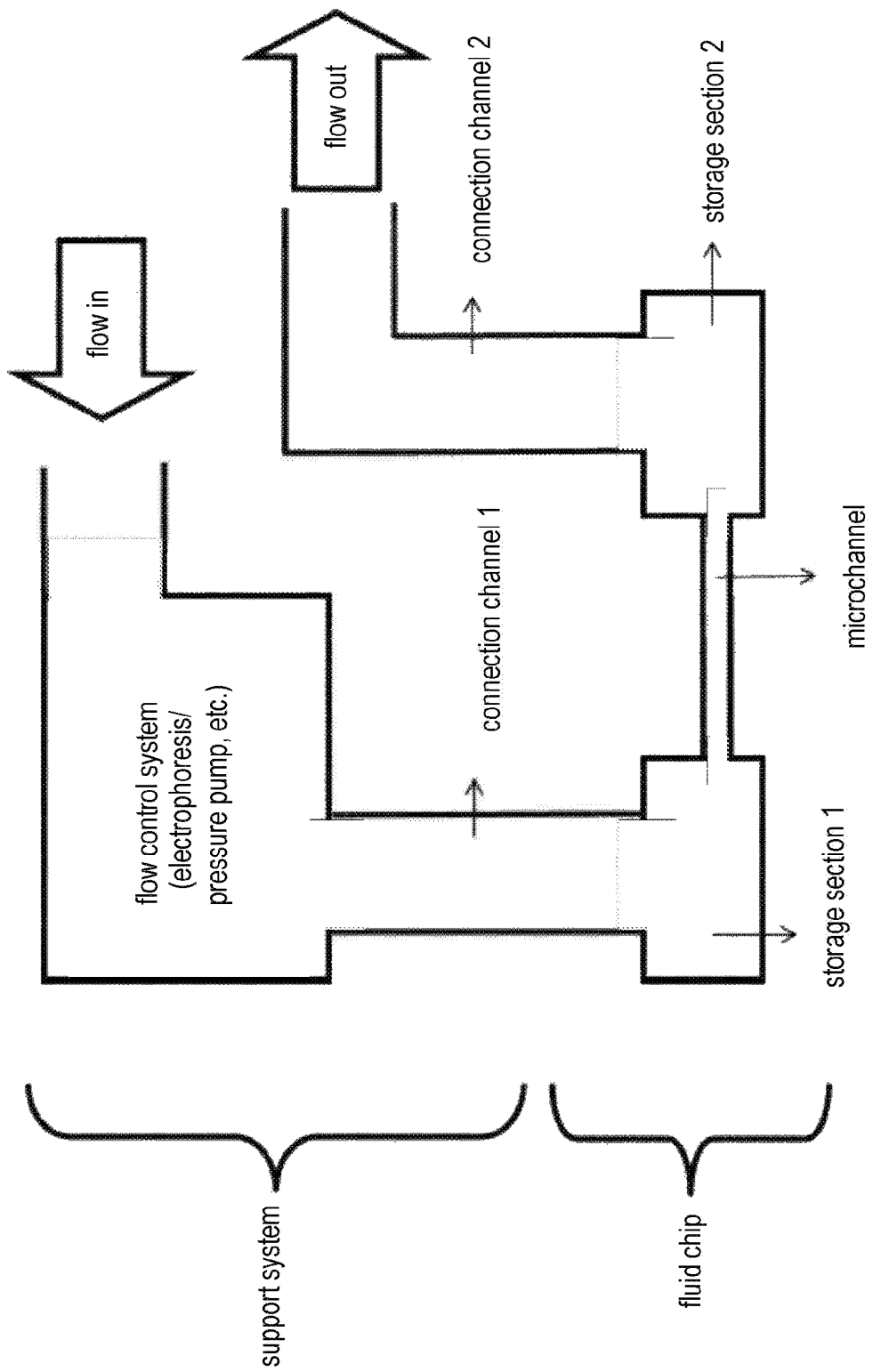
FIG. 9 is a view illustrating an application scenario of a microchannel in a microfluidic device according to some embodiments of the present disclosure.

FIG. 9 is a view illustrating an application of a microchannel in a microfluidic device according to some embodiments of the present disclosure. Referring to FIG. 9, a fluid sample (for example, a gas or a liquid) is driven by a flow control system to flow into a connection channel 1. In some embodiments, the flow control system comprises one or a combination of electrophoresis, a pressure pump, and other driving mechanisms. Through the connection channel 1, the fluid sample flows into a storage section 1, which is in turn connected to the microchannel provided by an embodiment of the disclosure. The storage section 1 itself may be a microchannel. The fluid sample then flows into the microchannel, which controls the transport of the fluid sample in a fluid chip. Under the control of the microchannel, the fluid sample flows into a storage section 2, a connection channel 2, and finally flows out of the microfluidic device.

In another aspect, the present disclosure provides a sensor comprising a microchannel structure described herein or manufactured by a method described herein.

In another aspect, the present disclosure provides a sensor comprising a thin film transistor described herein or manufactured by a method described herein.

In another aspect, the present disclosure provides a sensing system comprising a sensor described herein.

In another aspect, the present disclosure provides a microfluidic device comprising a microchannel structure described herein or manufactured by a method described herein.

In another aspect, the present disclosure provides a microfluidic system comprising a microfluidic device described herein.

In another aspect, the present disclosure provides a lab-on-chip device comprising a microchannel structure described herein or manufactured by a method described herein.

In another aspect, the present disclosure provides a lab-on-chip system comprising a lab-on-chip device described herein.

Figure 10:
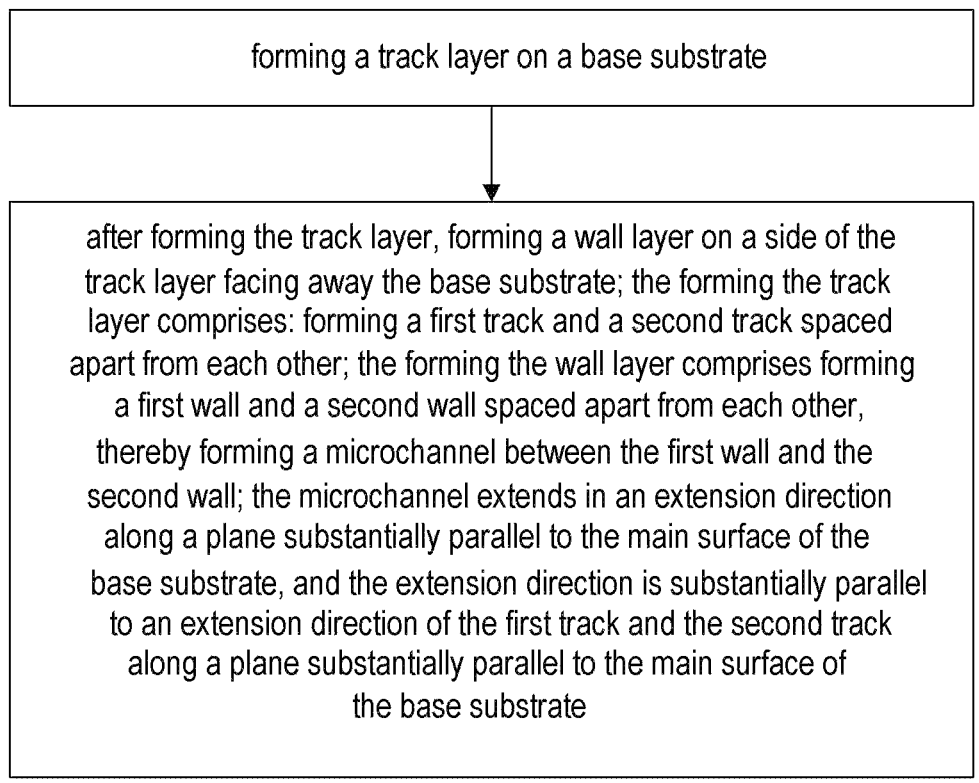
FIG. 10 is a flow chart illustrating a method for manufacturing a microchannel structure according to some embodiments of the present disclosure.

In another aspect, the present disclosure provides a method of manufacturing a microchannel structure. FIG. 10 is a flow chart illustrating a method of manufacturing a microchannel structure according to some embodiments of the disclosure. Referring to FIG. 10, in some embodiments, the method comprises: forming a track layer on a base substrate; and after forming the track layer, forming a wall layer on a side of the track layer facing away the base substrate. In some embodiments, the step of forming a track layer comprises forming a first track and a second track spaced apart from each other. In some embodiments, the step of forming a wall layer comprises forming a first wall and a second wall spaced apart from each other, thereby forming a microchannel between the first wall and the second wall. In some embodiments, the microchannel is formed to extend in an extension direction along a plane substantially parallel to the main surface of the base substrate, and the extension direction is substantially parallel to an extension direction of the first track and the second track along a plane substantially parallel to the main surface of the base substrate.

Figure 11E:
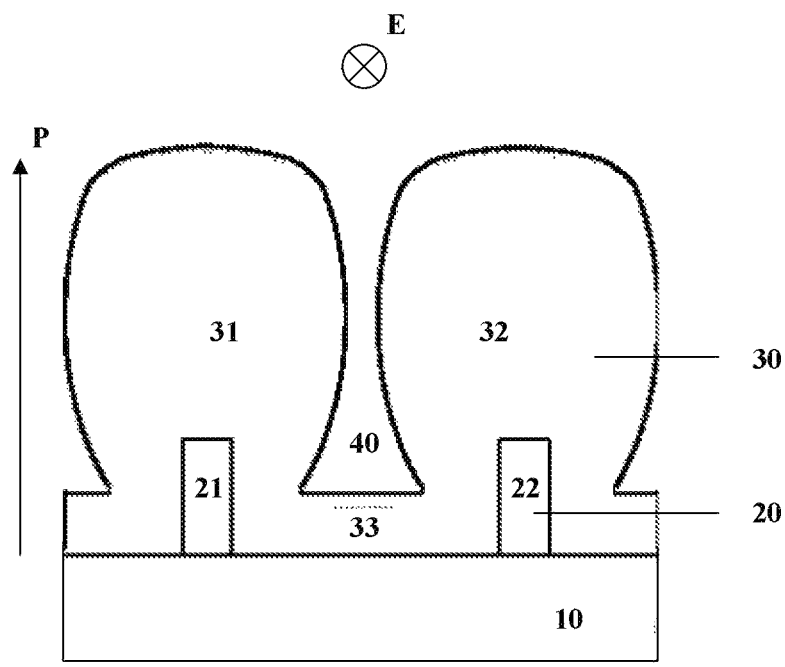

FIGS. 11A to 11F illustrate a process of manufacturing a microchannel structure according to some embodiments of the present disclosure. Referring to FIG. 11A, a base substrate 10 is provided. Compared with a conventional manufacturing method of a microchannel structure, the manufacturing method of a microchannel structure provided by the embodiment of the present disclosure enables the microchannel structure to be directly manufactured on a base substrate on which other components of an electronic device (for example, a sensor) have been formed. Therefore, in some embodiments, the base substrate 10 comprises an electrode structure. In some embodiments, the base substrate 10 is a substrate having an electrode structure of a sensor (including a sensing circuit).

Referring to FIG. 11B, a track layer 20 is formed on the base substrate 10. In some embodiments, the step of forming the track layer 20 comprises forming a first track 21 and a second track 22. In some embodiments, the first track 21 and the second track 22 are formed in a single patterning step. An example of a suitable method for forming the track layer 20 include: ultraviolet exposure, electron beam exposure, laser direct writing, nanoimprint, photolithographic stripping, etc., or a combination thereof. An example of a suitable method for forming the first track 21 and the second track 22 include: photolithography process, electron beam lithography process, nanoimprint lithography, etching process (for example, dry etching), thermal etching process, ion beam etching, high temperature cauterization, or a combination thereof. In an example, a track layer material is firstly deposited on the base substrate 10 to form a track layer material layer, and then the track layer material layer is patterned to form the first track 21 and the second track 22. Depending on the application of the microchannel structure, the track layer 20 may be made of various suitable materials, including insulating materials, semiconductor materials, conductive materials, or combinations thereof.

A process of manufacturing a track layer will be introduced below based on nanoimprint in combination with a dry etching process. Specific steps may include: depositing a track layer material film; coating an imprint glue; a thermal/ultraviolet curing imprinting process; a residual glue removal process; a pattern transfer process to form a pattern before etching; dry etching to form a track layer.

The structure of the track layer may be designed according to the microchannel structure that needs to be formed. Based on different structures of the track layer, complicated microchannel shapes such as a shunt microchannel, a spiral microchannel, and the like may be fabricated. A micro-nano structure with a special surface may also be designed according to the required microchannel structure. For example, a micro-nano hole in a direction perpendicular to the base substrate may be fabricated by means of a closed ring structure of the track layer to obtain a micro-nano surface having a huge surface area. That is, in this embodiment, the track layer is a ring structure formed on the base substrate, and a ring-shaped wall layer may be formed by a sputtering process based on the ring structure, thereby obtaining a micro-nano hole that is perpendicular to the base substrate.

FIG. 11C is an example of a plan view of the first track 21 and the second track 22. Referring to FIG. 11C, in some embodiments, the first track 21 and the second track 22 extend substantially parallel to each other along a plane parallel to the main surface of the base substrate 10. In some embodiments, the extension direction E of the first track 21 and the second track 22 along a plane substantially parallel to the main surface of the base substrate 10 defines an extension direction of a microchannel to be formed in subsequent steps.

Referring to FIG. 11D, after the track layer 20 is formed, a wall layer material is deposited on a side of the track layer 20 facing away the base substrate 10, thereby forming a wall layer material layer 30". The wall layer material layer 30" may cover the track layer 20. Due to the presence of the first track 21 and the second track 22, compared with other regions of the base substrate 10, the wall layer material is firstly deposited on and near the first track 21 and the second track 22 at a relatively fast rate. As shown in FIG. 11D, in some embodiments, the wall layer material layer 30" comprises a first protrusion 31" covering the first track 21, a second protrusion 32" covering the second track 22, and a base portion 33" between the first protrusion 31" and the second protrusion 32".

Various suitable deposition methods and suitable deposition devices may be used for deposition of the wall layer material. Examples of suitable deposition methods include sputtering (e.g., magnetron sputtering) and evaporation (e.g., chemical vapor deposition method, plasma enhanced chemical vapor deposition (PECVD) method, thermal vapor deposition method, atomic layer deposition (ALD) method, and electron beam evaporation method). In some embodiments, the wall layer material is deposited by a sputtering method.

Various suitable sputtering methods and suitable sputtering apparatuses may be used for sputtering of the wall layer material. Examples of suitable sputtering apparatuses include: a DC (direct current) sputtering apparatus, a radio frequency sputtering apparatus, an intermediate frequency sputtering apparatus, a pulsed DC sputtering apparatus, a magnetron sputtering apparatus, and a pulsed DC magnetron sputtering apparatus. Examples of appropriate sputtering include physical sputtering and reactive sputtering. In an example, the base substrate 10 on which the track layer 20 is formed is placed in a sputtering chamber and subjected to sputtering process with a sputtering target including a wall layer material or a precursor thereof. In another example, sputtering is performed at room temperature, the sputtering atmosphere includes oxygen and argon, the sputtering power is 5 kW, the sputtering atmosphere pressure is 0.2 Pa, and the sputtering apparatus is a magnetron sputtering apparatus.

The step of forming a wall layer by a sputtering process may specifically comprise:

Step 101: placing a base substrate (sample) on which a track layer is formed into a chamber of a sputtering apparatus. The sputtering apparatus may be a DC sputtering instrument, a DC pulse sputtering instrument, an RF sputtering instrument, an intermediate frequency sputtering instrument, and the like. The sputtering process may be physical sputtering or reactive sputtering. The target used by sputtering is the material or reactants of the formed micro-nano structure. Specifically, the sample may be placed in a sample tray in the chamber, and the sample tray is required to have good thermal conductivity. The sputtering temperature is controlled at a low temperature, such as room temperature sputtering. During the sputtering process, a heat dissipation system may be used to cool the sample tray. During the sputtering process, the substrate temperature is preferably controlled below 100° C.

Step 102: evacuating the chamber of the sputtering apparatus to a high vacuum state.

Step 103: injecting a sputtering ionizing gas such as argon, nitrogen, and the like into the sputtering chamber. For reactive sputtering, a reactive gas such as oxygen is required. After the gas is injected, the operating pressure inside the chamber is kept stable. The partial pressure of the reactive gas is controlled to ensure that reactive sputtering is performed completely.

Step 104: turning on a power supply to start the sputtering process, the sputtering power being adjusted according to the sputtering apparatus and the type of target.

After the wall layer material has been deposited, the optimal semiconductor characteristics may be achieved by processing methods such as doping annealing.

For the method of manufacturing a microchannel structure provided by the embodiment of the present disclosure, since the microchannel structure is naturally grown by sputtering and deposition, the size and shape of the formed microchannel are not directly limited by equipment precision for exposure, etching, etc., but are controlled by the spacing between the first track and the second track, the sectional shape of the channel between the first track and the second track, and the sputtering conditions which have low precision requirements, so that a low-precision mass production apparatus can be used to regulate the topography of a high-precision microchannel.

In some embodiments, the method further comprises controlling the size and shape of the microchannel by controlling the duration or power for sputtering the wall layer material. Longer sputtering time or higher sputtering power makes the first protrusion 31" and the second protrusion 32" become larger, and makes the microchannel become smaller.

Referring to FIG. 11E, in some embodiments, the microchannel 40 is formed between the first wall 31 and the second wall 32. In some embodiments, the sputtering duration or sputtering power is controlled such that the first wall 31 and the second wall 32 are formed to be at least partially separated from each other on a side of the microchannel 40 opposite to the base substrate 10, for example, the microchannel 40 is formed to be at least partially open on a side opposite to the base substrate 10. In some embodiments, the first wall 31 and the second wall 32 are formed to be separated from each other on the side of the microchannel 40 opposite to the base substrate 10 over the entire length of the microchannel 40 in the extension direction E along a plane substantially parallel to the main surface of the base substrate 10. In some embodiments, the first wall 31 and the second wall 32 are formed to be separated from each other on the side of the microchannel 40 opposite to the base substrate 10 over one or more first portions of the length of the microchannel 40 in the extension direction E along a plane substantially parallel to the main surface of the base substrate 10, and the first wall 31 and the second wall 32 are formed to be connected to each other on the side of the microchannel 40 opposite to the base substrate 10 over one or more second portions of the length of the microchannel 40 in the extension direction E along the plane substantially parallel to the main surface of the base substrate 10.

Referring to FIG. 11E, in some embodiments, the first wall 31 is formed to protrude facing away the base substrate 10 along a protruding direction P, and the second wall 32 is formed to protrude facing away the base substrate 10 along the protruding direction P. The first wall 31 and the second wall 32 are formed to be completely spaced apart from each other along the protruding direction P, thereby forming a microchannel 40 that is at least partially open on the side opposite to the base substrate 10.

Figure 11F:
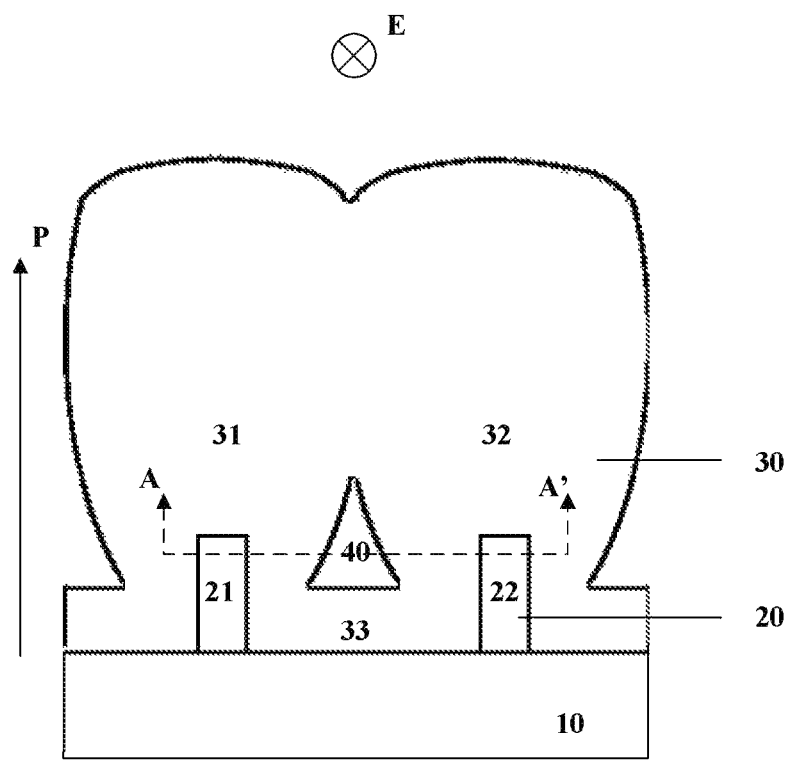

Referring to FIG. 11F, in some embodiments, the microchannel 40 is formed between the first wall 31 and the second wall 32. In some embodiments, the sputtering duration or sputtering power is controlled such that the first wall 31 and the second wall 32 are formed to be connected to each other on the side of the microchannel 40 opposite to the base substrate 10, for example, the microchannel 40 is a closed channel. In some embodiments, the first wall 31 and the second wall 32 are formed to be connected to each other on the side of the microchannel 40 opposite to the base substrate 10 over the entire length of the microchannel 40 in the extension direction E along a plane substantially parallel to the main surface of the base substrate 10. In some embodiments, the first wall 31 and the second wall 32 are formed to be connected to each other on the side of the microchannel 40 opposite to the base substrate 10 over one or more first portions of the length of the microchannel 40 in the extension direction E along a plane substantially parallel to the main surface of the base substrate 10, and the first wall 31 and the second wall 32 are formed to be separated from each other on the side of the microchannel 40 opposite to the base substrate 10 over one or more second portions of the length of the microchannel 40 in the extension direction E along the plane substantially parallel to the main surface of the base substrate 10.

Referring to FIGS. 11E and 11F, in some embodiments, the step of forming a wall layer further comprises forming a third wall 33 that connects the first track 21 and the second track 22. As described above, the rate at which the wall layer material is deposited in a region between the first track 21 and the second track 22 is smaller than that at which it is deposited on the first track 21 and the second track 22, and the third wall 33 is formed to constitute a bottom of the microchannel 40. In some embodiments, the third wall 33 is formed to be in direct contact with the base substrate 10.

In the method provided by the embodiment of the present disclosure, the track layer 20 is firstly formed on the base substrate 10, and then a wall layer material is sputtered onto the track layer 20. The first track 21 and the second track 22 of the track layer 20 protrude upward from the base substrate and serve as main growth points for accumulating the wall layer material. As the wall layer material continues to accumulate on and around the first track 21 and the second track 22, the widths of the sections of the first protrusion 31" and the second protrusion 32" continue to increase, and the distance between the first protrusion 31" and the second protrusion 32" continues to decrease, thereby forming a high-resolution microchannel 40. Since the microchannel 40 is formed by sputtering the wall layer material onto the base substrate 10, the resolution of the microchannel 40 is not limited by the resolution of a patterning device or an etching device, and it is possible to avoid the need for development of suitable etchants for various different microchannel materials. The current method is applicable to formation of the microchannel 40 using various suitable materials.

In some embodiments, the wall layer may be formed using a photolithography process. In some embodiments, the photolithography process includes a patterning process and an etching process. Examples of the patterning process include UV exposure and development, electron beam exposure and development, laser-based direct writing process, nanoimprint, and the like. Examples of the etching process include dry etching, wet etching, reactive ion beam etching, and high-temperature calcination.

Another embodiment of the present disclosure provides a method of manufacturing a thin film transistor, which may comprise: providing a substrate; and forming a gate, a gate insulating layer, a source, a drain, and an active layer on the substrate; the active layer is provided with a microchannel, and the thin film transistor is configured to detect a sample in the microchannel.

In some embodiments, the method of manufacturing a thin film transistor may include the method of manufacturing a microchannel structure described herein (for example, the method described in FIGS. 10 and 11A to 11F). For example, a gate and a gate insulating layer may be firstly formed on a substrate successively to obtain a base substrate; then a source (equivalent to the first track) and a drain (equivalent to the second track) arranged discretely are formed on the base substrate by the method of manufacturing a track layer described above; and then an active layer is formed on the base substrate as well as the source and the drain by the method of manufacturing a wall layer described above.

Specifically, the step of forming an active layer may specifically comprise: forming a first wall and a second wall on a side of the source and the drain facing away the substrate, the first wall and the second wall forming a closed microchannel on a side opposite to the substrate; the microchannel extends in an extension direction along a plane substantially parallel to the main surface of the substrate, and the extension direction is substantially parallel to an extension direction of the source and the drain along a plane of the main surface of the substrate.

The step of forming an active layer may specifically further comprise: forming a third wall on a side of the gate insulating layer facing away the substrate to connect the source and the drain.

The source and the drain comprise conductive materials. The active layer comprises a semiconductor material. The substrate may be a glass or flexible substrate, etc. The gate, the gate insulating layer, and the source/drain may be formed by processes such as a patterning process. The active layer may be formed by a process such as sputtering.

In some embodiments, a further embodiment of the present disclosure provides a method of manufacturing a multilayer microchannel structure. Each layer of the multilayer microchannel structure may be manufactured by the method of manufacturing a microchannel described herein (for example, the method described in FIGS. 10 and 11A to 11F). In some embodiments, the multilayer microchannel structure is formed to comprise a first layer of microchannel structure and a second layer of microchannel structure, and the second layer of microchannel structure is formed to be stacked on top of the first layer of microchannel structure. Specifically, the step of forming a first layer of microchannel structure comprises: forming a track layer on a base substrate; and after forming the track layer, forming a wall layer on a side of the track layer facing away the base substrate. The step of forming a second layer of microchannel structure comprises: forming a second track layer on a second base substrate; and after forming the second track layer, forming a second wall layer on a side of the second track layer facing away the second base substrate. The step of forming a track layer comprises forming a first track and a second track spaced apart from each other, and the step of forming a wall layer comprises forming a first wall and a second wall spaced apart from each other, thereby forming a microchannel between the first wall and the second wall. The step of forming a second track layer comprises forming a third track and a fourth track spaced apart from each other, and the step of forming a second wall layer comprises forming a fourth wall and a fifth wall spaced apart from each other, thereby forming a second microchannel between the fourth wall and the fifth wall.

In some embodiments, the method of manufacturing a multilayer microchannel structure comprises: forming a first layer of the multilayer microchannel structure on a base substrate; forming a planarization layer on the first layer of the multilayer microchannel structure to form a flat surface; and forming a second layer of the multilayer microchannel structure on a side of the planarization layer facing away the base substrate. The planarization layer constitutes a second base substrate for forming the second layer of the multilayer microchannel structure.

Yet another embodiment of the present disclosure provides a method of manufacturing a sensor chip. In some embodiments, the method comprises: forming an electrode structure of the sensor chip on a base substrate; and after forming the electrode structure, forming one or more microchannel structures directly on the electrode structure. The step of forming the one or more microchannel structures may be performed as described above. In some embodiments, the step of forming one or more microchannel structures comprises: forming a track layer on a side of the electrode structure facing away the base substrate; and after forming the track layer, forming a wall layer on a side of the track layer facing away the electrode structure. In some embodiments, the step of forming a track layer comprises forming a first track and a second track spaced apart from each other. In some embodiments, the step of forming a wall layer comprises forming a first wall and a second wall that are at least partially spaced apart from each other, thereby forming a microchannel between the first wall and the second wall. In some embodiments, the first track and the second track are formed using an electrode material. The first track and the second track are formed as two sensor electrodes of the sensor chip.

The embodiments in this specification are all described in a progressive manner. Each embodiment focuses on the differences from other embodiments, and the same or similar parts between the embodiments may refer to each other.

In this specification, relational terms such as first and second are used only to distinguish one entity or operation from another entity or operation, and do not necessarily require or imply that these entities or operations have any such actual relationship or order. Moreover, the term "include", "comprise" or any other variant thereof is intended to encompass non-exclusive inclusion, such that a process, method, product or device that includes a series of elements includes not only those elements but also other elements that are not explicitly listed, or elements that are inherent to such a process, method, product or device. Without more restrictions, elements defined by the statement "including a . . . " do not exclude the existence of other identical elements in a process, method, product or device including those elements.

Embodiments of a microchannel structure, a manufacturing method thereof, a sensor, and a microfluidic device provided by the present disclosure have been described in detail above. The description of the above embodiments is only intended to facilitate understanding of the method and the core idea of the present disclosure. Meanwhile, a person having an ordinary skill in the art may, based on the ideas of the present disclosure, make modifications or variations to the embodiments herein, and the content of this specification should not be construed as limiting the scope of the present application.

The invention claimed is:

1. A thin film transistor, comprising:
a substrate, and
a source, a drain and an active layer on the substrate,
wherein the active layer comprises a first portion and a second portion on the source and the drain respectively, and
wherein the first portion and the second portion are at least partially spaced apart to form a microchannel between the first portion and the second portion,
wherein the first portion and the second portion of the active layer extend over the source and the drain respectively in a vertical direction facing away from a main surface of the substrate, so that the first portion covers the source and the second portion covers the drain,
wherein an area of a cross section of each of the first portion and the second portion parallel to the main surface of the substrate increases in the vertical direction so that a top of the first portion and a top of the second portion are connected to each other, such that the microchannel comprises a top-closed channel structure,
wherein the thin film transistor further comprises a gate, and
wherein the gate is between the substrate and the active layer in the vertical direction.

2. The thin film transistor according to claim 1,
wherein an orthographic projection of the first portion on the substrate overlaps an orthographic projection of the source on the substrate, and
wherein an orthographic projection of the second portion on the substrate overlaps an orthographic projection of the drain on the substrate.

3. The thin film transistor according to claim 1,
wherein a spacing between the source and the drain is greater than or equal to 5 nanometers and less than or equal to 50 micrometers, and
wherein the source and the drain both have a height greater than or equal to 5 nanometers and less than or equal to 50 micrometers.

4. A sensor comprising the thin film transistor according to claim 1.

5. The sensor according to claim 4,
wherein an area of a cross section of each of the first portion and the second portion parallel to the main surface of the substrate increases in the vertical direction so that a top of the first portion and a top of the second portion are connected to each other, such that the microchannel comprises a top-closed channel structure,
wherein the thin film transistor further comprises a gate, the gate is between the substrate and the active layer in the vertical direction.

6. The sensor according to claim 4,
wherein an orthographic projection of the first portion on the substrate overlaps an orthographic projection of the source on the substrate, and
wherein an orthographic projection of the second portion on the substrate overlaps an orthographic projection of the drain on the substrate.

7. The sensor according to claim 4,
wherein a spacing between the source and the drain is greater than or equal to 5 nanometers and less than or equal to 50 micrometers, and
wherein the source and the drain both have a height greater than or equal to 5 nanometers and less than or equal to 50 micrometers.

8. The sensor according to claim 4,
wherein the thin film transistor further comprises a gate and a gate insulating layer,
wherein the gate, the gate insulating layer, the source, the drain and the active layer are stacked on the substrate successively, and
wherein at least a portion of the gate insulating layer serves as a bottom of the microchannel.

9. The sensor according to claim 8,
wherein the active layer further comprises a third portion between the source and the drain, and
wherein the third portion is in direct contact with the gate insulating layer and serves as the bottom of the microchannel.

10. A thin film transistor, comprising:
a substrate, and
a source, a drain and an active layer on the substrate,
wherein the active layer comprises a first portion and a second portion on the source and the drain respectively, and
wherein the first portion and the second portion are at least partially spaced apart to form a microchannel between the first portion and the second portion,
wherein the first portion and the second portion of the active layer extend over the source and the drain respectively in a vertical direction facing away from a main surface of the substrate, so that the first portion covers the source and the second portion covers the drain, wherein the thin film transistor further comprises:
a gate and a gate insulating layer,
wherein the gate, the gate insulating layer, the source, the drain and the active layer are stacked on the substrate successively, and
wherein at least a portion of an upper surface of the gate insulating layer facing away the substrate serves as a bottom of the microchannel.

11. The thin film transistor according to claim 10,
wherein the active layer further comprises a third portion between the source and the drain, and
wherein the third portion is in direct contact with the gate insulating layer and serves as the bottom of the microchannel.

12. A method for manufacturing a thin film transistor, comprising:
providing a substrate;
forming a source and a drain on the substrate; and
forming an active layer on the substrate on which the source and the drain are formed,
wherein the active layer comprises a first portion and a second portion on the source and the drain respectively, and
wherein the first portion and the second portion are at least partially spaced apart to form a microchannel between the first portion and the second portion,
wherein the first portion and the second portion of the active layer extend over the source and the drain respectively in a vertical direction facing away from a main surface of the substrate, so that the first portion covers the source and the second portion covers the drain, wherein an area of a cross section of each of the first portion and the second portion parallel to the main surface of the substrate increases in the vertical direction so that a top of the first portion and a top of the second portion are connected to each other, such that the microchannel comprises a top-closed channel structure, wherein the thin film transistor further comprises a gate, and wherein the gate is between the substrate and the active layer in the vertical direction.

13. The method according to claim 12, wherein the forming the active layer comprises:

by taking the source and the drain as growing points, forming the first portion and the second portion of the active layer on the substrate respectively by a sputtering process.

14. The method according to claim 12, further comprising:

forming a gate and a gate insulating layer on the substrate prior to forming the source and the drain, wherein the forming the active layer further comprises forming a third portion of the active layer on the gate insulating layer with a material of the active layer, and wherein the third portion serves as a bottom of the microchannel.

\* \* \* \* \*